(12) United States Patent
Juengling

(10) Patent No.: US 10,790,286 B2
(45) Date of Patent: Sep. 29, 2020

(54) APPARATUSES INCLUDING 3D MEMORY ARRAYS, METHODS OF FORMING THE APPARATUSES, AND RELATED ELECTRONIC SYSTEMS

(71) Applicant: Micron Technology, Inc., Boise, ID (US)

(72) Inventor: Werner Juengling, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 75 days.

(21) Appl. No.: 16/212,418

(22) Filed: Dec. 6, 2018

(65) Prior Publication Data

US 2020/0185385 A1    Jun. 11, 2020

(51) Int. Cl.
| | | |
|---|---|---|
| G11C 5/02 | (2006.01) | |
| H01L 27/108 | (2006.01) | |
| G11C 11/4091 | (2006.01) | |
| H01L 23/528 | (2006.01) | |
| H01L 49/02 | (2006.01) | |
| G11C 11/408 | (2006.01) | |

(52) U.S. Cl.
CPC ........ *H01L 27/108* (2013.01); *G11C 11/4085* (2013.01); *G11C 11/4091* (2013.01); *H01L 23/528* (2013.01); *H01L 27/10844* (2013.01); *H01L 27/10897* (2013.01); *H01L 28/60* (2013.01)

(58) Field of Classification Search
CPC ..... G11C 5/02; G11C 11/408; G11C 11/4076; G11C 11/4091
USPC .......................................................... 365/51
See application file for complete search history.

(56) References Cited

U.S. PATENT DOCUMENTS

| | | | |
|---|---|---|---|
| 4,920,517 A | | 4/1990 | Yamauchi et al. |
| 6,043,562 A | * | 3/2000 | Keeth ...................... G11C 7/18 257/210 |
| 6,075,737 A | | 6/2000 | Mullarkey et al. |
| 6,504,756 B2 | | 1/2003 | Gonzalez et al. |
| 8,872,247 B2 | * | 10/2014 | Tomishima ............ G11C 8/005 257/300 |
| 9,190,494 B2 | | 11/2015 | Juengling |
| 9,715,918 B1 | | 7/2017 | Kawamura |
| 9,773,728 B1 | | 9/2017 | Juengling |

(Continued)

*Primary Examiner* — Hoai V Ho
(74) *Attorney, Agent, or Firm* — TraskBritt

(57) ABSTRACT

An apparatus comprises a base structure, a memory structure, and interconnect structures. The base structure comprises odd sense amplifiers and even sense amplifiers. The memory structure comprises 3D memory arrays having decks each comprising digit lines, additional digit lines, memory cells, and word lines. The digit lines comprise odd digit lines and even digit lines, and the additional digit lines comprise additional odd digit lines and additional even digit lines. The memory cells are connected to the digit lines and the additional digit lines, and each comprise two transistors and one capacitor. The word lines are connected to the memory cells, and comprise odd word lines and even word lines. The interconnect structures comprise odd interconnect structures connecting the odd sense amplifiers to the odd digit lines and the additional odd digit lines, and even interconnect structures connecting the even sense amplifiers to the even digit lines and the additional even digit lines. Related electronic systems and methods are also described.

26 Claims, 25 Drawing Sheets

(56) References Cited

U.S. PATENT DOCUMENTS

| | | |
|---|---|---|
| 9,847,337 B1 | 12/2017 | Juengling |
| 2003/0223292 A1 | 12/2003 | Nejad et al. |
| 2009/0207681 A1* | 8/2009 | Juengling ................ G11C 7/02 |
| | | 365/230.03 |
| 2009/0238010 A1 | 9/2009 | Juengling |
| 2011/0267912 A1 | 11/2011 | Juengling |
| 2014/0117507 A1 | 5/2014 | Juengling |
| 2017/0278559 A1* | 9/2017 | Hush ...................... G11C 5/025 |

* cited by examiner

APPARATUSES INCLUDING 3D MEMORY ARRAYS, METHODS OF FORMING THE APPARATUSES, AND RELATED ELECTRONIC SYSTEMS

TECHNICAL FIELD

Embodiments of the disclosure relate to the field of semiconductor device design and fabrication. More specifically, embodiments of the present disclosure relate to apparatuses including 3D memory arrays, to methods of forming the apparatuses, and to related electronic systems.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs.

One example of a semiconductor device is a memory device. Memory devices are generally provided as internal integrated circuits in computers or other electronic devices. There are many types of memory including, but not limited to, random-access memory (RAM), read only memory (ROM), dynamic random access memory (DRAM), synchronous dynamic random access memory (SDRAM), flash memory, and resistance variable remory. Non-limiting examples of resi stance variable memory include resistive random access memory (RRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

A typical memory cell of a memory device includes one access device, such as a transistor, and one memory storage structure, such as a capacitor. Modern applications for semiconductor devices can employ significant quantities of memory cells, arranged in memory arrays exhibiting rows and columns of the memory cells. The memory cells may be electrically accessed through digit lines (e.g., bit lines, data lines) and word lines (e.g., access lines) arranged along the rows and columns of the memory cells of the memory arrays. Memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells.

Control logic devices within a base structure underlying a memory array of a memory device have been used to control operations (e.g., access operations, read operations, write operations) on the memory cells of the memory device. An assembly of the control logic devices may be provided in electrical communication with the memory cells of the memory array by way of routing and interconnect structures. However, as the number of decks of a 3D memory array increases, electrically connecting the memory cells of the different decks of the 3D memory array to the assembly of control logic devices within the base control logic structure can create sizing and spacing complications associated with the increased quantities and dimensions of routing and interconnect structures required to facilitate the electrical connection. In addition, the quantities, dimensions, and arrangements of the different control logic devices employed within the base control logic structure can also undesirably impede reductions to the size of a memory device, increases to the storage density of the memory device, and/or reductions in fabrication costs.

It would, therefore, be desirable to have improved apparatus structures and apparatuses facilitating higher packing densities, as well as methods of forming the apparatus structures and the apparatuses, and electronic systems including the apparatus structures and the apparatuses.

DETAILED DESCRIPTION

Figure 1:
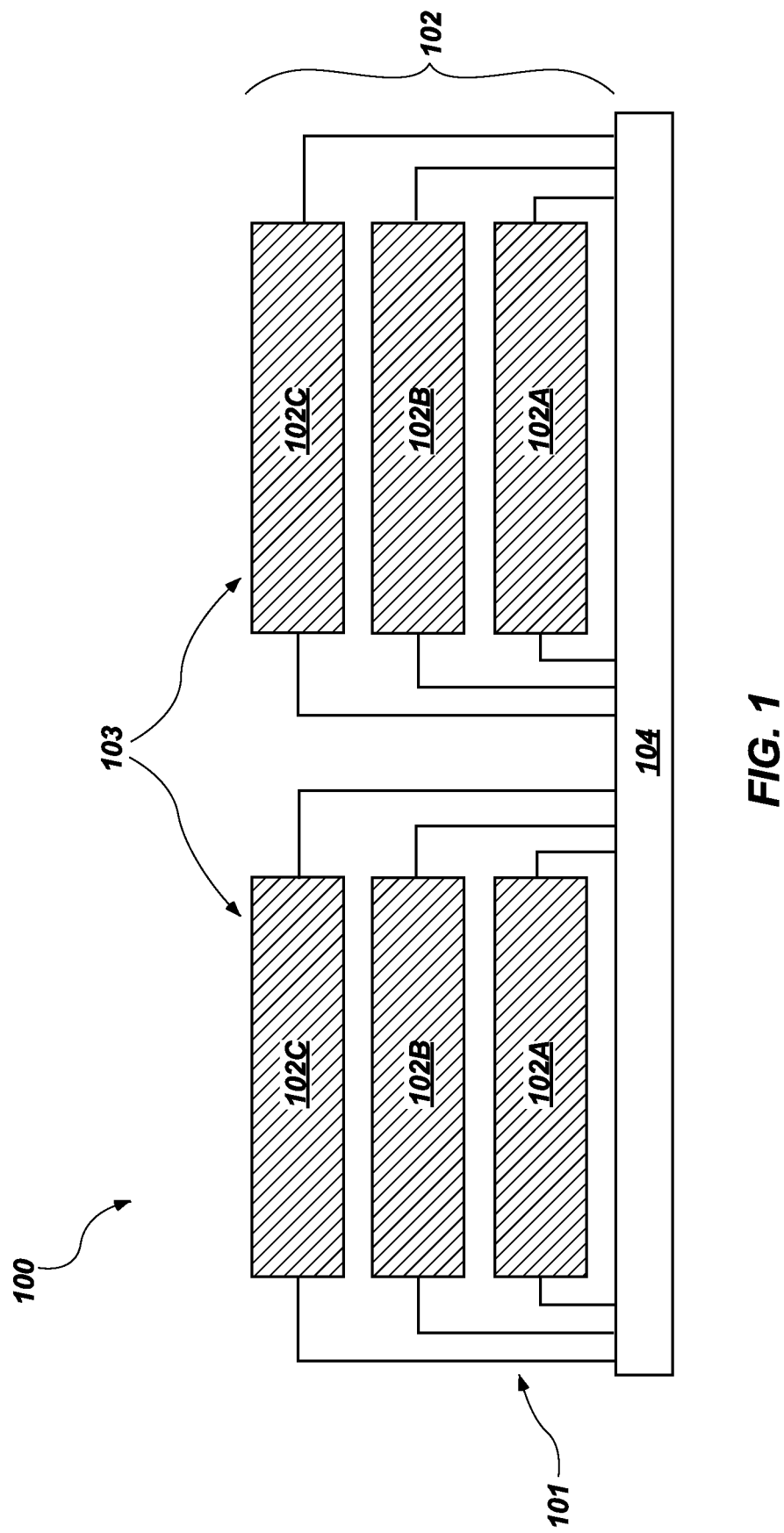
FIG. 1 is a simplified side elevation schematic view of an apparatus, in accordance with embodiments of the disclosure.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing an apparatus (e.g., a semiconductor device; a memory device, such as a DRAM device). The apparatus structures described below do not form a complete apparatus. Only those process acts and structures necessary to understand the embodiments of the disclosure are described in detail below. Additional acts to form the complete apparatus from the apparatus structures may be performed by conventional fabrication techniques. Also note, any drawings accompanying the application are for illustrative purposes only, and are thus not drawn to scale. Additionally, elements common between figures may retain the same numerical designation.

As used herein, the terms "configured" and "configuration" refer to a size, shape, material composition, material distribution, orientation, and arrangement of one or more of at least one structure and at least one apparatus facilitating operation of one or more of the structure and the apparatus in a predetermined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, "vertically-neighboring" or "longitudinally-neighboring" features (e.g., structures, devices) means and includes features located most vertically proximate (e.g., vertically closest) one another. In addition, as used herein, "horizontally-neighboring" or "laterally-neighboring" features (e.g., structures, devices) means and includes features located most horizontally proximate (e.g., horizontally closest) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, at least 99.9% met, or even 100.0% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless the context indicates otherwise, the materials described herein may be formed by any suitable process including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD), or epitaxial growth. Depending on the specific material to be formed, the technique for depositing or growing the material may be selected by a person of ordinary skill in the art. In addition, unless the context indicates otherwise, the removal of materials described herein may be accomplished by any suitable process including, but not limited to, etching (e.g., dry etching, wet etching, vapor etching), ion milling, abrasive planarization (e.g., chemical-mechanical planarization ("CMP")), or other known methods.

FIG. 1 shows a simplified side elevation schematic view of an apparatus 100 (e.g., a semiconductor device; a memory device, such as a DRAM device), in accordance with embodiments of the disclosure. As shown in FIG. 1, the apparatus 100 includes a memory structure 101 and a base structure 104 underlying the memory structure 101. The memory structure 101 includes a plurality of 3D memory arrays 103 each including a plurality of memory decks 102 (e.g., memory levels, memory tiers) in a vertically stacked arrangement relative to one another. The memory decks 102 of each 3D memory array 103 are each in electrical communication with the base structure 104. For clarity and ease of understanding of the drawings and related description, FIG. 1 shows each of the 3D memory arrays 103 of the memory structure 101 as individually including three (3) memory decks 102; a first memory deck 102A, a second memory deck 102B over the first memory deck 102A, and a third memory deck 102C over the second memory deck 102B. In additional embodiments, the 3D memory arrays 103 may each individually include a different number of memory decks 102. For example, the 3D memory arrays 103 of the memory structure 101 may each include greater than three (3) memory decks 102, or may each include less than three (3) memory decks 102.

Figure 2:
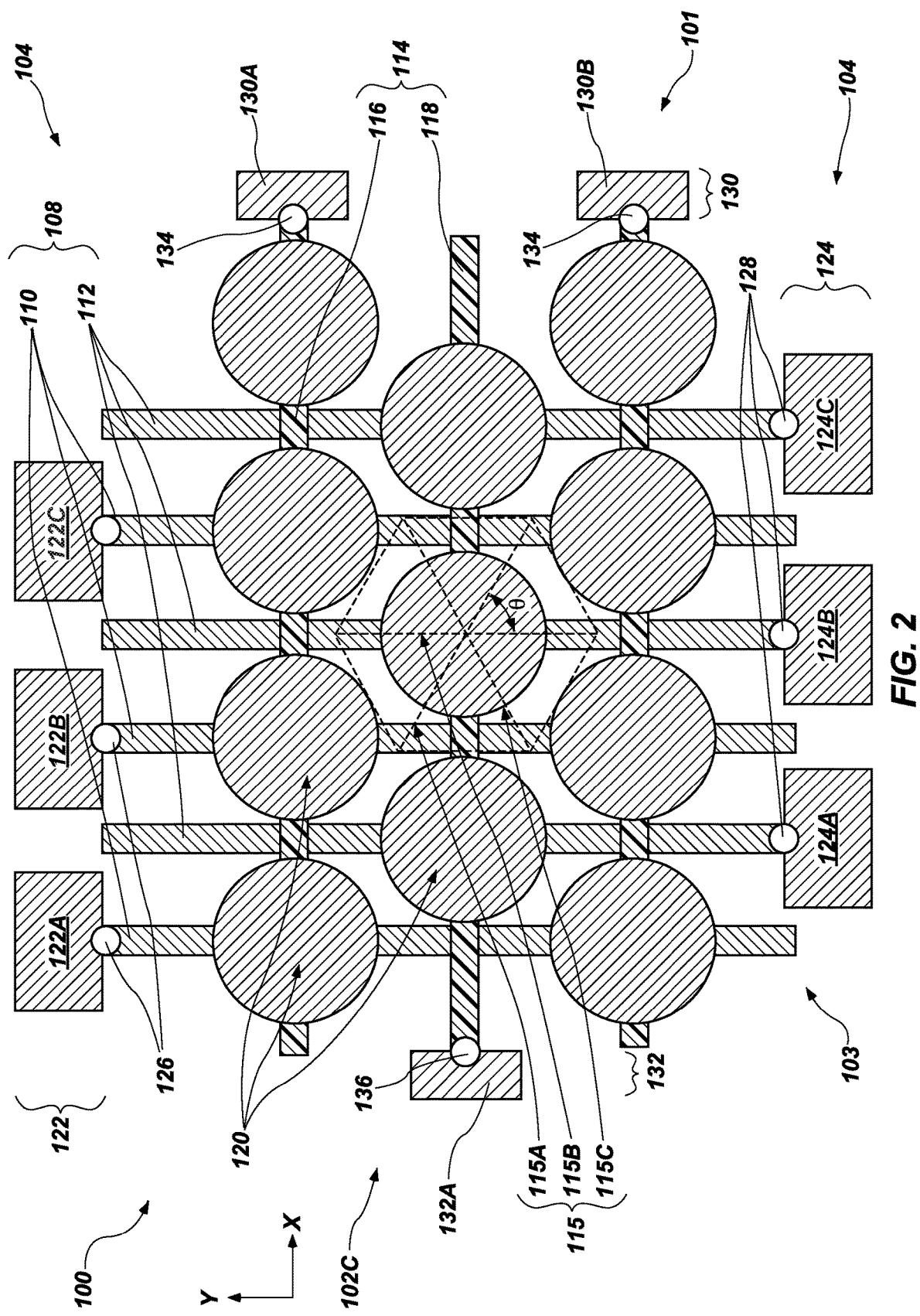
FIG. 2 is simplified top-down schematic view of the apparatus shown in FIG. 1, in accordance with embodiments of the disclosure.

FIG. 2 illustrates a simplified, partial top-down schematic view of the apparatus 100 shown in FIG. 1. FIG. 2 shows components of the third memory deck 102C of one of the 3D memory arrays 103 of the memory structure 101 of the apparatus 100, as well as components of the base structure 104 thereunder electrically connected to the components of the third memory deck 102C. For clarity and ease of understanding of the FIG. 2 and the related description, not all of the components and component configurations of the third memory deck 102C and the base structure 104 are illustrated in FIG. 2. In addition, the other memory decks 102 (e.g., the first memory deck 102A (FIG. 1), the second memory deck 102B (FIG. 1)) of the 3D memory array 103 may exhibit similar components and component arrangements to those of the third memory deck 102C.

As shown in FIG. 2, the third memory deck 102C includes digit lines 108 (e.g., bit lines) laterally extending in a first direction (e.g., the Y-direction), word lines 114 (e.g., access lines) laterally extending in a second direction (e.g., the X-direction) different than (e.g., orthogonal to) the first direction, and memory cells 120 operatively associated with the digit lines 108 and the word lines 114. Columns of the memory cells 120 may laterally extend in the first direction (e.g., the Y-direction), and rows of the memory cells 120 may laterally extend in the second direction (e.g., the X-direction). A memory cell 120 is located at each row and column intersection, with memory cells 120 in the same column connected to the same digit line 108, and memory cells 120 in the same row connected to the same word line 114. Put another way, the digit lines 108 are interleaved, such that an activated word line 114 will access a memory cell 120 on each digit line 108.

The digit lines 108 of the memory deck 102 include odd digit lines 110 and even digit lines 112. The odd digit lines 110 laterally alternate (e.g., in the X-direction) with the even digit lines 112. Some columns of the memory cells 120 are operatively associated with the odd digit lines 110, and additional columns of the memory cells 120 are operatively associated with the even digit lines 112. The digit lines 108 (e.g., the odd digit lines 110 and the even digit lines 112) may each individually exhibit a width (e.g., in the X-direction) of about 24 nanometers (nm). In addition, a pitch between digit lines 108 (e.g., odd digit lines 110 and even digit lines 112) most laterally proximate one another may be about 48 nm, a pitch between laterally-neighboring odd digit lines 110 may be about 96 nm, and a pitch between laterally-neighboring even digit lines 112 may be about 96 nm.

The odd digit lines 110 may be connected to odd sense amplifiers 122 (e.g., a first odd sense amplifier 122A, a second odd sense amplifier 122B, a third odd sense amplifier 122C) within the base structure 104 by way of odd digit line interconnect structures 126 (e.g., odd digit line routing structures). In addition, the even digit lines 112 may be connected to even sense amplifiers 124 (e.g., a first even sense amplifier 124A, a second even sense amplifier 124B, a third even sense amplifier 124C) within the base structure 104 by way of even digit line interconnect structures 128 (e.g., even digit line routing structures). As shown in FIG. 2, the odd digit lines 110 may be connected to and route from (e.g., in the negative Y-direction) the odd digit line interconnect structures 126 at first peripheral end of the 3D memory array 103, and the even digit lines 112 may be connected to and route from (e.g., in the positive Y-direction) the even digit line interconnect structures 128 at a second peripheral end of the 3D memory array 103 opposing the first peripheral end of the 3D memory array 103.

The word lines 114 of the memory deck 102 include odd word lines 116 and even word lines 118. The odd word lines 116 laterally alternate (e.g., in the Y-direction) with the even word lines 118. Some rows of the memory cells 120 are operatively associated with the odd word lines 116, and additional rows of the memory cells 120 are operatively associated with the even word lines 118. The word lines 114 (e.g., the odd word lines 116 and the even word lines 118) may each individually exhibit a width (e.g., in the Y-direction) of about 24 nm. In addition, a pitch between word lines 114 (e.g., odd word lines 116 and even word lines 118) most laterally proximate one another may be about 83 nm, a pitch between laterally-neighboring odd word lines 116 may be about 166 nm, and a pitch between laterally-neighboring even word lines 118 may be about 166 nm.

The odd word lines 116 may be connected to odd word line drivers 130 (e.g., a first word line driver 130A, a second word line driver 130B) within the base structure 104 by way of odd word line interconnect structures 134 (e.g., odd word line routing structures). In addition, the even word lines 118 may be connected to even word line drivers 132 (e.g., a first word line driver 132A) within the base structure 104 by way of even word line interconnect structures 136 (e.g., even word line routing structures). As shown in FIG. 2, the odd word lines 116 may be connected to and route from (e.g., in the positive X-direction) the odd word line interconnect structures 134 at third peripheral end of the 3D memory array 103, and the even word lines 118 may be connected to and route from (e.g., in the negative X-direction) the even word line interconnect structures 136 at a fourth peripheral end of the 3D memory array 103 opposing the third peripheral end of the 3D memory array 103.

As described in further detail below, each of the memory cells 120 may comprise two (2) transistors, and one (1) capacitor vertically between and electrically coupled to the two (2) transistors. The vertical arrangement of the two (2) transistors of each of the memory cells 120 may permit the digit lines 108 operatively associated with the memory cells 120 to be relatively shorter than the digit lines of conventional configurations, reducing digit line resistance and making it relatively easier to drive current through the digit lines 108. As described in further detail below, each of the memory cells 120 may be operatively associated with two (2) of the digit lines 108. For example, columns of the memory cells 120 operatively associated with the odd digit lines 110 may each individually exhibit a first odd digit line 110 thereunder (or thereover) and a second odd digit line 110 thereover (or thereunder). The first odd digit line 110 may underlie and be connected to first (e.g., lower) transistors of the memory cells 120 of the column, and the second odd digit line 110 may overlie and be connected to second (e.g., upper) transistors of the memory cells 120 of the column. The first odd digit line 110 may be connected to a first odd digit line interconnect structure 126 electrically connected to an odd sense amplifier 122; and the second odd digit line 110 may be connected to a second odd digit line interconnect structure 126 electrically connected to the odd sense amplifier 122. Similarly, additional columns of the memory cells 120 operatively associated with the even digit lines 112 may each individually exhibit a first even digit line 112 thereunder (or thereover) and a second even digit line 112 thereover (or thereunder). The first even digit line 112 may underlie and be connected to first (e.g., lower) transistors of the memory cells 120 of the additional column, and the second even digit line 112 may overlie and be connected to second (e.g., upper) transistors of the memory cells 120 of the additional column. The first even digit line 112 may be connected to a first even digit line interconnect structure 128 electrically connected to an even sense amplifier 124; and the second even digit line 112 may be connected to a second even digit line interconnect structure 128 electrically connected to the even sense amplifier 124.

As shown in FIG. 2, the third memory deck 102C (as well as the other memory decks 102 (FIG. 1) of the 3D memory array 103 including the third memory deck 102C, and the memory decks 102 (FIG. 1) of each other 3D memory array 103 of the memory structure 101) includes a hexagonal pattern (e.g., a hexagonal arrangement, a hexagonal grid, a hexagonal array) of the memory cells 120. The hexagonal pattern exhibits a repeating lateral arrangement of seven (7) memory cells 120, wherein one (1) of the seven (7) memory cells 120 is substantially laterally centered between six (6) other of the seven (7) memory cells 120. The hexagonal pattern exhibits different three (3) axes of symmetry 115 (e.g., a first axis of symmetry 115A, a second axis of symmetry 115B, and a third axis of symmetry 115C) in the same lateral plane (e.g., the XY plane) about a center of the laterally-centered memory cell 120 of the seven (7) memory cells 120. Different axes of symmetry 115 directly radially adjacent to one another (e.g., the first axis of symmetry 115A and the second axis of symmetry 115B, the second axis of symmetry 115B and the third axis of symmetry 115C) may be radially separated from one another by an angle θ of about 60 degrees. The hexagonal pattern of the memory cells 120 exhibits a smaller lateral area relative to a conventional square pattern having the same type and quantity of memory cells. The other components (e.g., contacts, routing structures, devices within the base structure 104, such as word line drivers and sense amplifiers) of the apparatus 100 (FIG. 1) are configured and positioned to facilitate the hexagonal pattern of the memory cells 120 of each of the memory decks 102 (FIG. 1) of each of the 3D memory arrays 103 (FIG. 1) of the memory structure 101 (FIG. 1), as described in further detail below.

Figure 3:
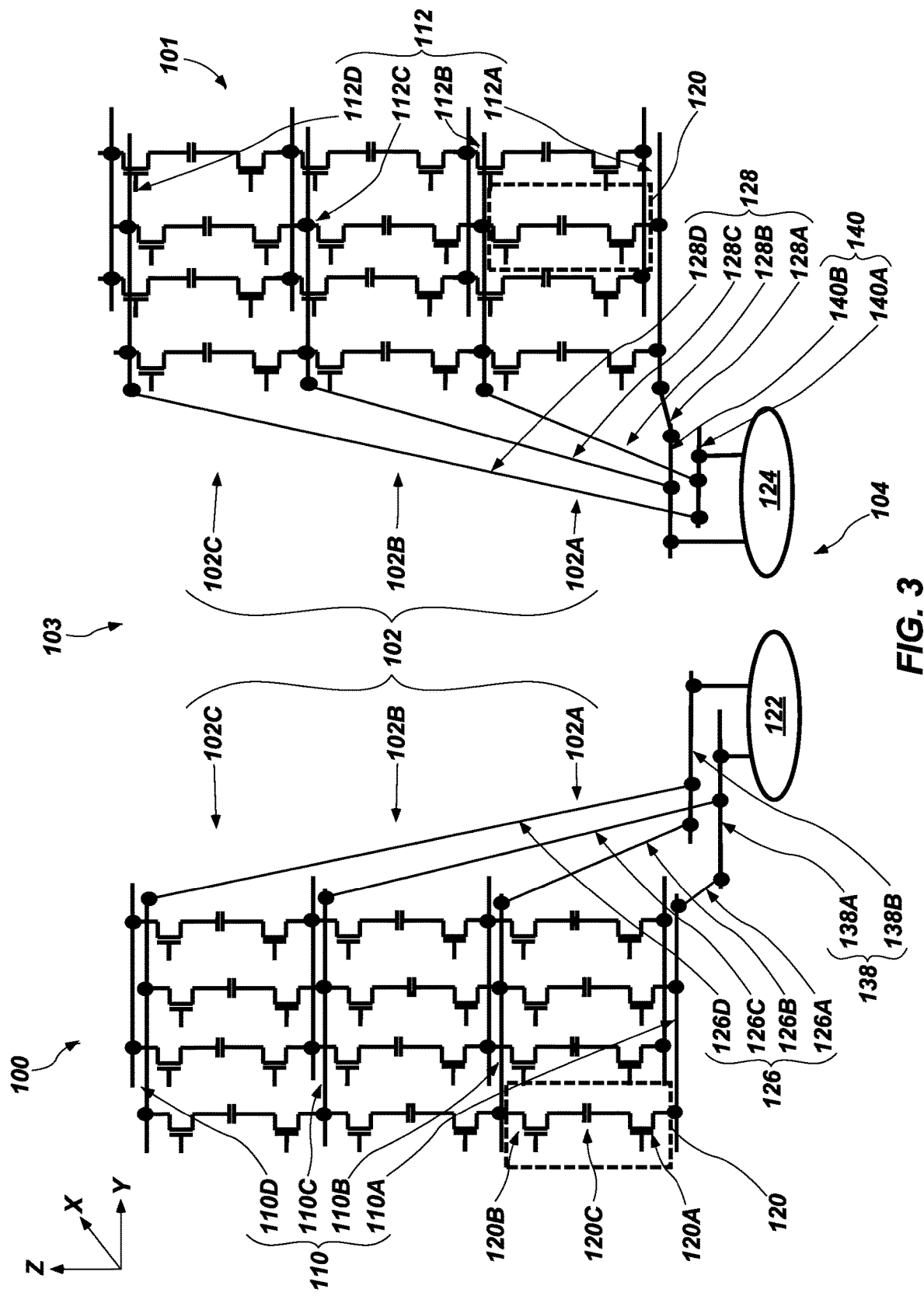
FIG. 3 is a simplified side elevation electrical schematic view of the apparatus shown in FIG. 1, in accordance with embodiments of the disclosure.

FIG. 3 shows a simplified, partial side elevation electrical schematic view of the apparatus 100 shown in FIG. 1. FIG. 3 depicts one of the 3D memory arrays 103 of the memory structure 101, as well as interactions between components of the 3D memory array 103 and components of the base structure 104. As shown in FIG. 3, the memory cells 120 of each of the memory decks 102 (e.g., the first memory deck 102A, the second memory deck 102B, the third memory deck 102C) of the 3D memory array 103 each individually include a first transistor 120A (e.g., a vertically lower transistor), a second transistor 120B (e.g., a vertically upper transistor), and a capacitor 120C (e.g., storage node structure) vertically between and electrically coupled to the first transistor 120A and the second transistor 120B.

As shown in FIG. 3, for each of the memory decks 102 of the 3D memory array 103, some of the memory cells 120 are connected to a pair of odd digit lines 110 and other of the memory cells 120 are connected to a pair of even digit lines 112. For example, first transistors 120A of a portion of the memory cells 120 within the first memory deck 102A may be connected to a first odd digit line 110A and second transistors 120B of the portion of the memory cells 120 may be connected to a second odd digit line 110B overlying the first odd digit line 110A; and first transistors 120A of another portion of the memory cells 120 within the first memory deck 102A may be connected to a first even digit line 112A and second transistors 120B of the another portion of the memory cells 120 may be connected to a second even digit line 112B overlying the first even digit line 112A. As another example, first transistors 120A of a portion of the memory cells 120 within the second memory deck 102B may be connected to the second odd digit line 110B and second transistors 120B of the portion of the memory cells 120 may be connected to a third odd digit line 110C overlying the second odd digit line 110B; and first transistors 120A of another portion of the memory cells 120 within the second memory deck 102B may be connected to the second even digit line 112B and second transistors 120B of the another portion of the memory cells 120 may be connected to a third even digit line 112C overlying the second even digit line 112B. As a further example, first transistors 120A of a portion of the memory cells 120 within the third memory deck 102C may be connected to the third odd digit line 110C and second transistors 120B of the portion of the memory cells 120 may be connected to a fourth odd digit line 110D overlying the third odd digit line 110C; and first transistors 120A of another portion of the memory cells 120 within the third memory deck 102C may be connected to the third even digit line 112C and second transistors 120B of the another portion of the memory cells 120 may be connected to a fourth even digit line 112D overlying the third even digit line 112C.

With continued reference to FIG. 3, within the base structure 104, an odd sense amplifier 122 (e.g., one of the first odd sense amplifier 122A, the second odd sense amplifier 122B, and the third odd sense amplifier 122C shown in FIG. 2) is electrically connected to a vertical stack of the odd digit lines 110 (e.g., the first odd digit line 110A, the second odd digit line 110B, the third odd digit line 110C, and the fourth odd digit line 110D); and an even sense amplifier 124 (e.g., one of the first even sense amplifier 124A, the second even sense amplifier 124B, and the third even sense amplifier 124C shown in FIG. 2) is electrically connected to a vertical stack of the even digit lines 112 (e.g., the first even digit line 112A, the second even digit line 112B, the third even digit line 112C, and the fourth even digit line 112D). The odd sense amplifier 122 is electrically connected to a pair of odd base digit lines 138, including a first odd base digit line 138A (e.g., a "true" digit line) and a second odd base digit line 138B (e.g., a "complementary" digit line, a digit bar line). The first odd base digit line 138A and the second odd base digit line 138B may connect to different regions (e.g., opposing ends) of the odd sense amplifier 122 than one another, and may be positioned laterally adjacent one another within the base structure 104. In addition, the even sense amplifier 124 is electrically connected to a pair of even base digit lines 140, including a first even base digit line 140A (e.g., an additional "true" digit line) and a second even base digit line 140B (e.g., an additional "complementary" digit line, an additional digit bar line). The first even base digit line 140A and the second even base digit line 140B may connect to different regions (e.g., opposing ends) of the even sense amplifier 124 than one another, and may be positioned laterally adjacent one another within the base structure 104.

The odd base digit lines 138 (e.g., the first odd base digit line 138A, the second odd base digit line 138B) connected to the odd sense amplifier 122 within the base structure 104 may be electrically connected to the odd digit lines 110 (e.g., the first odd digit line 110A, the second odd digit line 110B, the third odd digit line 110C, and the fourth odd digit line 110D) of the vertical stack of the odd digit lines 110 by way of the odd digit line interconnect structures 126. As shown in FIG. 3, the first odd digit line 110A may be electrically connected to the first odd base digit line 138A through a first odd digit line interconnect structure 126A extending (e.g., vertically extending) between the first odd digit line 110A and the first odd base digit line 138A. The second odd digit line 110B may be electrically connected to the second odd base digit line 138B through a second odd digit line interconnect structure 126B extending (e.g., vertically extending) between the second odd digit line 110B and the second odd base digit line 138B. The third odd digit line 110C may be electrically connected to the first odd base digit line 138A through a third odd digit line interconnect structure 126C extending (e.g., vertically extending) between the third odd digit line 110C and the first odd base digit line 138A. The fourth odd digit line 110D may be electrically connected to the second odd base digit line 138B through a fourth odd digit line interconnect structure 126D extending (e.g., vertically extending) between the fourth odd digit line 110D and the second odd base digit line 138B.

The even base digit lines 140 (e.g., the first even base digit line 140A, the second even base digit line 140B) connected to the even sense amplifier 124 within the base structure 104 may be electrically connected to the even digit lines 112 (e.g., the first even digit line 112A, the second even digit line 112B, the third even digit line 112C, and the fourth even digit line 112D) of the vertical stack of the even digit lines 112 by way of the even digit line interconnect structures 128. As shown in FIG. 3, the first even digit line 112A may be electrically connected to the second even base digit line 140B through a first even digit line interconnect structure 128A extending (e.g., vertically extending) between the first even digit line 112A and the second even base digit line 140B. The second even digit line 112B may be electrically connected to the first even base digit line 140A through a second even digit line interconnect structure 128B extending (e.g., vertically extending) between the second even digit line 112B and the first even base digit line 140A. The third even digit line 112C may be electrically connected to the second even base digit line 140B through a third even digit line interconnect structure 128C extending (e.g., vertically extending) between the third even digit line 112C and the second even base digit line 140B. The fourth even digit line 112D may be electrically connected to the first even base digit line 140A through a fourth even digit line interconnect structure 140D extending (e.g., vertically extending) between the fourth even digit line 112D and the first even base digit line 140A.

For clarity and ease of understanding of the drawings and related description, FIG. 3 depicts the vertical stack of the odd digit lines 110 (as well as the portion of the memory cells 120, the odd sense amplifier 122, the odd base digit lines 138, and the odd digit line interconnect structures 126 operatively associated therewith) as being positioned laterally adjacent the vertical stack of the even digit lines 112 in the Y-direction (as well as the additional portion of the memory cells 120, the even sense amplifier 124, the even base digit lines 140, and the even digit line interconnect structures 128 operatively associated therewith). However, it will be understood and appreciated that the vertical stack of the even digit lines 112 (as well as the additional portion of the memory cells 120, the even sense amplifier 124, the even base digit lines 140, and the even digit line interconnect structures 128 operatively associated therewith) would be positioned behind (e.g., into the page) the vertical stack of the odd digit lines 110 (as well as the portion of the memory cells 120, the odd sense amplifier 122, the odd base digit lines 138, and the odd digit line interconnect structures 126 operatively associated therewith), such that the vertical stack of the even digit lines 112 is positioned laterally adjacent the vertical stack of the odd digit lines 110 in the X-direction in a manner consistent with the arrangement (e.g., layout, pattern) depicted in FIG. 2.

With continued reference to FIG. 3, odd digit line interconnect structures 126 (e.g., the first odd digit line interconnect structure 126A, the second odd digit line interconnect structure 126B, the third odd digit line interconnect structure 126C, the fourth odd digit line interconnect structure 126D) associated with different odd digit lines 110 (e.g., the first odd digit line 110A, the second odd digit line 110B, the third odd digit line 110C, the fourth odd digit line 110D) of individual vertical stacks of the odd digit lines 110 may be at least partially laterally offset from (e.g., unaligned with) one another (e.g., in the Y-direction) to facilitate connection to ends of the different odd digit lines 110. In addition, laterally-winding paths (e.g., routes) at the ends of the different odd digit lines 110 and/or laterally-winding conductive routing structures coupled to but vertically offset from the ends of the different odd digit lines 110 may also be employed to connect the different odd digit lines 110 to the odd digit line interconnect structures 126. By way of non-limiting example, FIGS. 4 and 5 show the connections between different odd digit line interconnect structures 126 and the different odd digit lines 110 of one of the 3D memory arrays 103 of the memory structure 101 of the apparatus 100.

Figure 4:
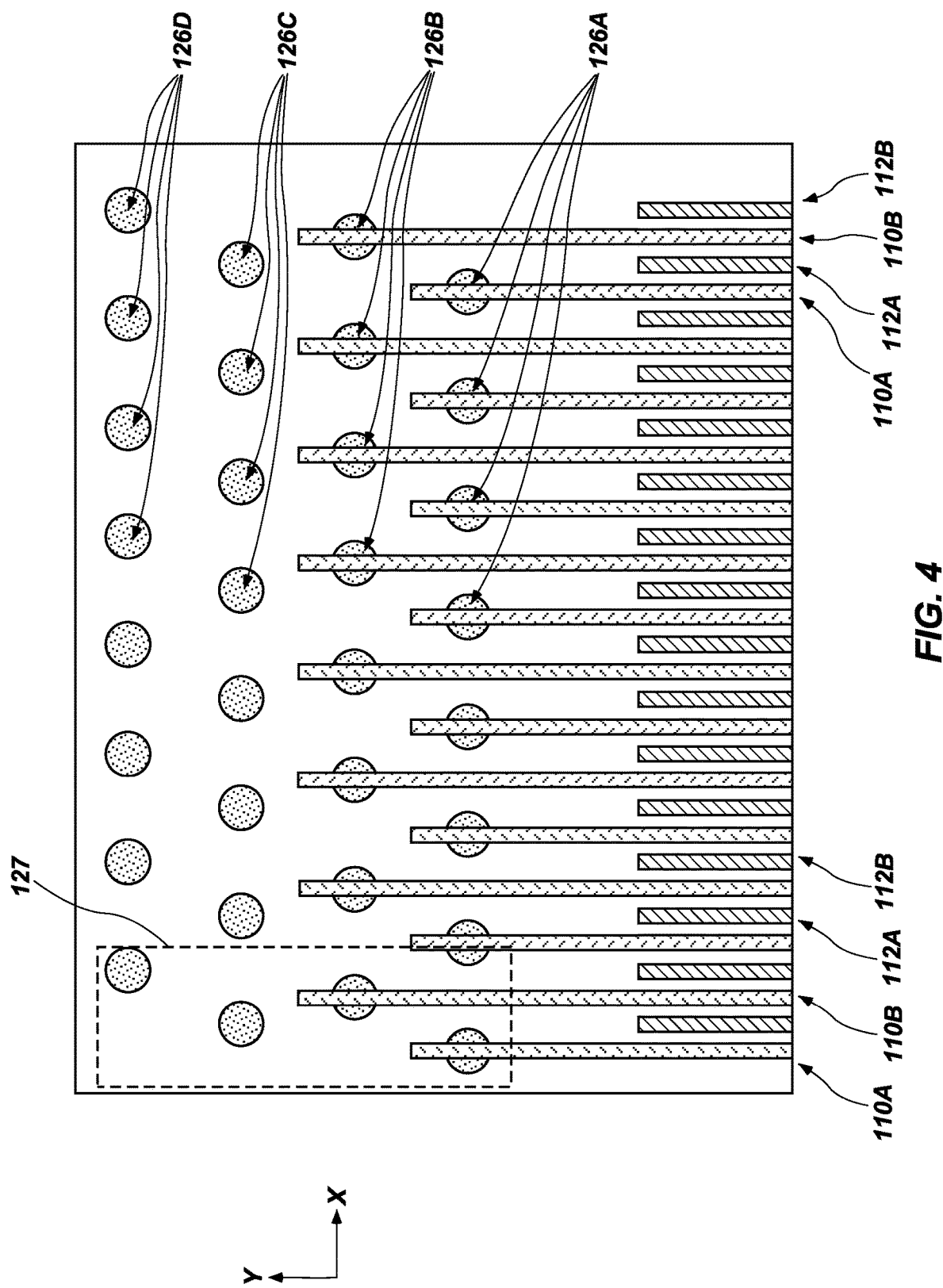
FIGS. 4 and 5 are simplified plan views showing digit line termination regions within the apparatus shown in FIG. 1, in accordance with embodiments of the disclosure.
Figure 5:
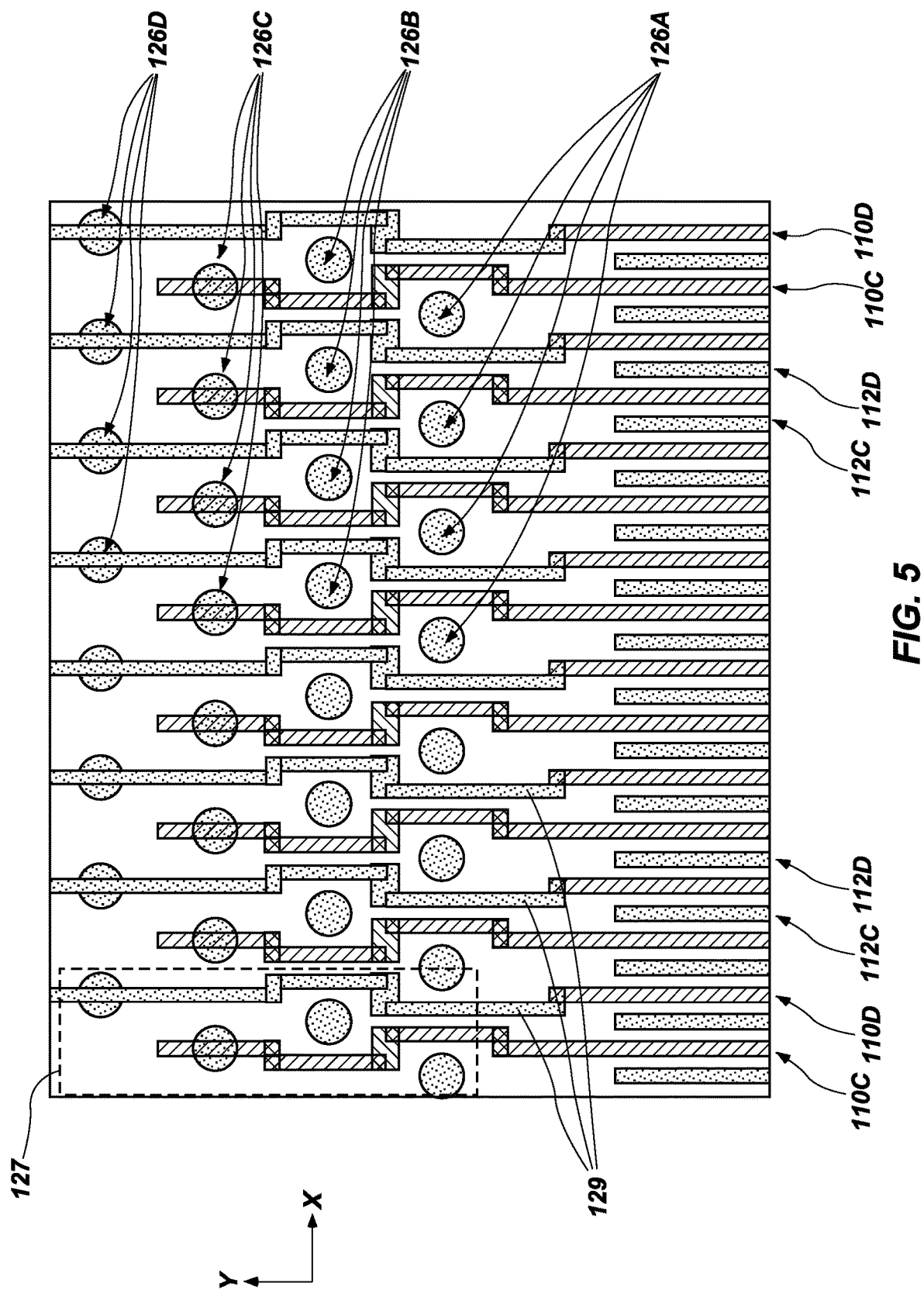

FIG. 4 illustrates a simplified plan view of digit line termination regions for first odd digit lines 110A and second odd digit lines 110B of different vertical stacks of odd digit lines 110 (FIG. 3). In FIG. 4, the dashed rectangle 127 surrounds a grouping of four (4) different odd digit line interconnect structures 126 (e.g., including a first odd digit line interconnect structure 126A, a second odd digit line interconnect structure 126B, a third odd digit line interconnect structure 126C, and a fourth odd digit line interconnect structure 126D) that may be operatively associate with a single (e.g., only one) vertical stack of odd digit lines 110 (FIG. 3) and a single odd sense amplifier 122 (FIG. 3). As shown in FIG. 4, the grouping pattern is repeated throughout in the X-direction, with each grouping individually corresponding to different odd digit line interconnect structures 126 (FIG. 3) operatively associated with a single vertical stack of odd digit lines 110 (FIG. 3) and a single odd sense amplifier 122 (FIG. 3). The third odd digit line interconnect structures 126C and the fourth odd digit line interconnect structures 126D shown in FIG. 4 vertically extend to vertically higher odd digit lines 110 (e.g., third odd digit lines 110C, fourth odd digit lines 110D as shown in FIG. 3) of the 3D memory array 103 (FIG. 3), as described in further detail below with reference to FIG. 5.

As shown in FIG. 4, the first odd digit line interconnect structure 126A, the second odd digit line interconnect structure 126B, the third odd digit line interconnect structure 126C, and the fourth odd digit line interconnect structure 126D associated with each vertical stack of odd digit lines 110 (FIG. 3) of the 3D memory array 103 (FIG. 3) may be laterally offset from one another (e.g., in the X-direction and in the Y-direction). For example, within the area of the dashed rectangle 127 depicted in FIG. 4, the first odd digit line interconnect structure 126A, the second odd digit line interconnect structure 126B, the third odd digit line interconnect structure 126C, and the fourth odd digit line interconnect structure 126D may all be diagonally positioned relative to one another.

With continued reference to FIG. 4, end portions of the first odd digit lines 110A may individually substantially linearly extend to and contact the first odd digit line interconnect structures 126A. Put another way, the end portions of the first odd digit lines 110A may not laterally extend in substantially non-linear paths (e.g., winding paths, curved paths) to the first odd digit line interconnect structure 126A. Similarly, end portions of the second odd digit lines 110B may individually substantially linearly extend to and contact the second odd digit line interconnect structures 126B. Put another way, the end portions of the second odd digit lines 110B may not laterally extend in substantially non-linear paths (e.g., winding paths, curved paths) to the second odd digit line interconnect structures 126B.

As shown in FIG. 4, first even digit lines 112A and second even digit lines 112B of the 3D memory array (FIG. 3) may exhibit end portions positioned laterally between (e.g., in the X-direction) parts of the end portions of the first odd digit lines 110A and the second odd digit lines 110B. The first even digit lines 112A and second even digit lines 112B respectively route from first even digit line interconnect structures and second even digit line interconnect structures positioned at a different peripheral end of the 3D memory array 103 (FIGS. 1 through 3) than the first odd digit line interconnect structures 126A and the second odd digit line interconnect structures 126B.

FIG. 5 illustrates a simplified plan view of digit line termination regions for third odd digit lines 110C and fourth odd digit lines 110D of different vertical stacks of odd digit lines 110 (FIG. 3). As shown in FIG. 5, end portions of the third odd digit lines 110C may individually non-linearly extend to and contact the third odd digit line interconnect structures 126C. For example, for each vertical stack of odd digit lines 110 (FIG. 3) the end portion of the third odd digit line 110C thereof may wind around the first odd digit line interconnect structure 126A and the second odd digit line interconnect structure 126B operatively associated with the vertical stack to route to and contact the third odd digit line interconnect structure 126C operatively associated with the vertical stack. The end portions of the third odd digit lines 110C may include multiple connected segments extending in different lateral directions (e.g., the X-direction, the Y-direction) than one another to path (e.g., route) around the first odd digit line interconnect structures 126A and the second odd digit line interconnect structures 126B and to the third odd digit line interconnect structures 126C.

With continued reference to FIG. 5, end portions of the fourth odd digit lines 110D may be connected to conductive routing structures 129 that individually non-linearly extend to and contact the fourth odd digit line interconnect structures 126D. The conductive routing structures 129 may be located at a different vertical position (e.g., a vertically below) the end portions of the third odd digit lines 110C. For each vertical stack of odd digit lines 110 (FIG. 3) conductive routing structures 129 connected to the fourth odd digit line interconnect structures 126D may wind around the first odd digit line interconnect structure 126A, the second odd digit line interconnect structure 126B, and the third odd digit line interconnect structures 126C operatively associated with the vertical stack to route to and contact the fourth odd digit line interconnect structure 126D operatively associated with the vertical stack. The conductive routing structures 129 may, for example, be formed and connected to the end portions of the fourth odd digit lines 110D through convention conventional litho-etch-litho-etch (LELE) processes, which are not described in detail herein.

With returned reference to FIG. 3, even digit line interconnect structures 128 (e.g., the first even digit line interconnect structure 128A, the second even digit line interconnect structure 128B, the third even digit line interconnect structure 128C, the fourth even digit line interconnect structure 128D) associated with different even digit lines 112 (e.g., the first even digit line 112A, the second even digit line 112B, the third even digit line 112C, the fourth even digit line 112D) of individual vertical stacks of the even digit lines 112 of the apparatus 100 may also be at least partially laterally offset from (e.g., unaligned with) one another (e.g., in the Y-direction) to facilitate connection to ends of the different even digit lines 112. Laterally-winding paths (e.g., routes) at the ends of the different even digit lines 112 and/or additional laterally-winding conductive routing structures coupled to but vertically offset from the ends of the different even digit lines 112 may also be employed to connect the different even digit lines 112 to the even digit line interconnect structures 128. The connections between different even digit line interconnect structures 128 and the different even digit lines 112 of the 3D memory array 103 of the apparatus 100 may be substantially similar to those of the different odd digit line interconnect structures 126 and the different odd digit lines 110 previously discussed with reference to FIGS. 4 and 5, but at a different, opposing peripheral end of the 3D memory array 103.

Figure 6:
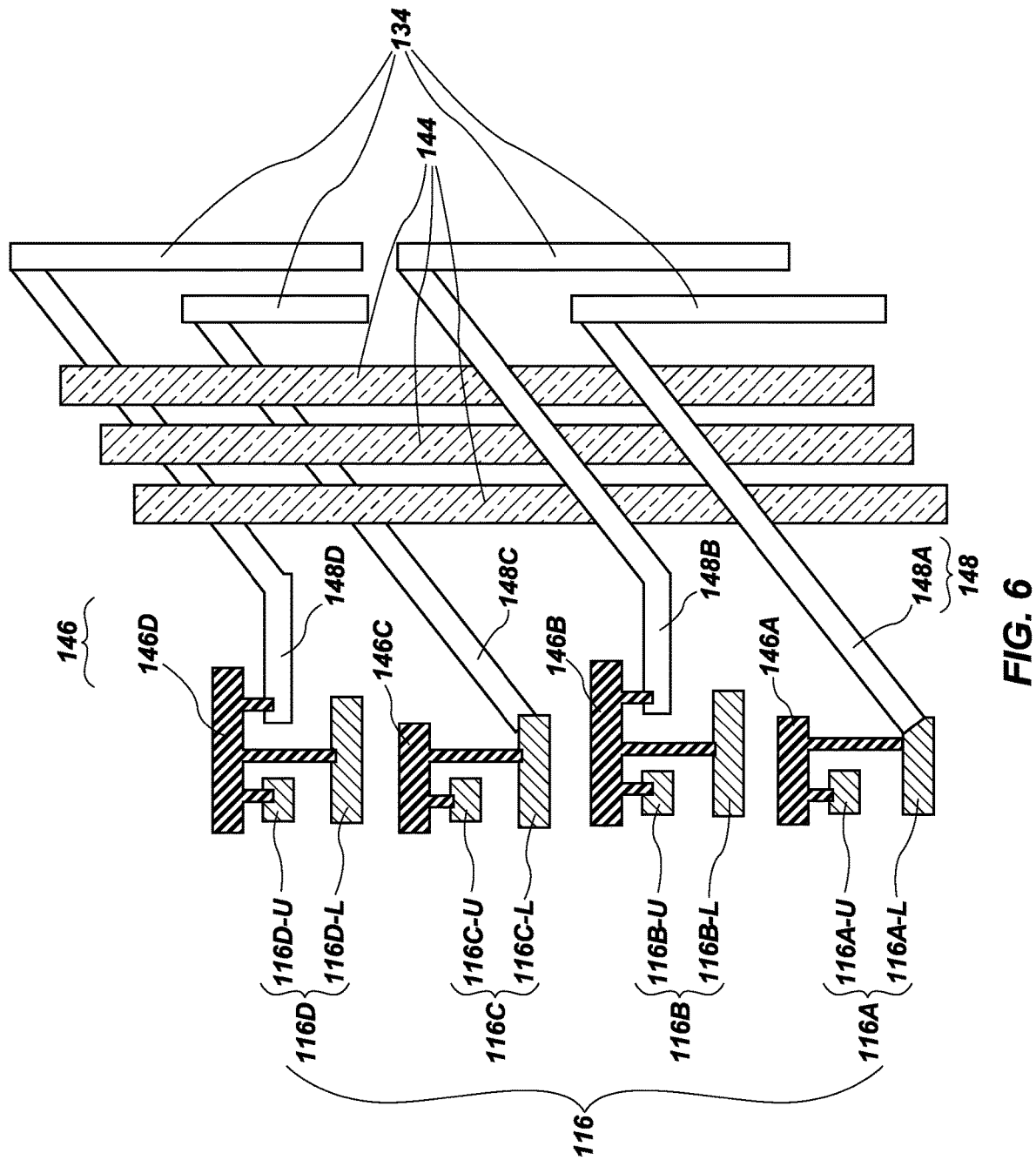
FIG. 6 is a simplified perspective view showing word line termination regions within the apparatus shown in FIG. 1, in accordance with embodiments of the disclosure.

FIG. 6 illustrates a simplified perspective view of word line termination regions for different odd word lines 116 within a 3D memory array 103 (FIGS. 1-3) of the memory structure 101 (FIGS. 1 and 2). As shown in FIG. 6, the odd word lines 116 include a first pair of odd word lines 116A, a second pair of odd word lines 116B, a third pair of odd word lines 116C, and a fourth pair of odd word lines 116D. The first pair of odd word lines 116A includes a first lower word line 116A-L and a first upper word line 116A-U; the second pair of odd word lines 116B includes a second lower word line 116B-L and a second upper word line 116B-U; the third pair of odd word lines 116C includes a third lower word line 116C-L and a third upper word line 116C-U; and the fourth pair of odd word lines 116D includes a fourth lower word line 116D-L and a fourth upper word line 116D-U. The first pair of odd word lines 116A and the second pair of odd word lines 116B may form a first vertical stack of odd word lines 116, wherein the first upper word line 116A-U vertically overlies the first lower word line 116A-L, the second lower word line 116B-L vertically overlies the first upper word line 116A-U, and the second upper word line 116B-U vertically overlies the second lower word line 116B-L. The third pair of odd word lines 116C and the fourth pair of odd word lines 116D may form a second vertical stack of odd word lines 116 laterally offset from the first vertical, wherein the third upper word line 116C-U vertically overlies the third lower word line 116C-L, the fourth lower word line 116D-L vertically overlies the third upper word line 116C-U, and the fourth upper word line 116D-U vertically overlies the fourth lower word line 116D-L. Each of the odd word lines 116 of the first vertical stack (e.g., each of the first lower word line 116A-L, the first upper word line 116A-U, the second lower word line 116B-L, and the second upper word line 116B-U) may be substantially laterally aligned with one another; and the each of the odd word lines 116 of the second vertical stack (e.g., each of the third lower word line 116C-L, the third upper word line 116C-U, the fourth lower word line 116D-L, and the fourth upper word line 116D-U) may be substantially laterally aligned with one another.

The different pairs of the odd word lines 116 may be connected to different memory cells 120 (FIGS. 2 and 3) of the 3D memory array 103 (FIGS. 1-3) of the memory structure 101 (FIGS. 1 and 2). For example, the first lower word line 116A-L and the first upper word line 116A-U of the first pair of odd word lines 116A may respectively be connected to first transistors 120A (FIG. 3) and second transistors 120B (FIG. 3) of memory cells 120 (FIG. 3) within a first memory deck 102A of the 3D memory array 103 (FIG. 3); and the second lower word line 116B-L and the second upper word line 116B-U of the second pair of odd word lines 116B may respectively be connected to first transistors 120A (FIG. 3) and second transistors 120B (FIG. 3) of memory cells 120 (FIG. 3) within a second memory deck 102B (FIG. 3) of the 3D memory array 103 (FIG. 3). In addition, the third lower word line 116C-L and the third upper word line 116C-U of the third pair of odd word lines 116C may respectively be connected to first transistors 120A (FIG. 3) and second transistors 120B (FIG. 3) of additional memory cells 120 (FIG. 3) within the first memory deck 102A of the 3D memory array 103 (FIG. 3); and the fourth lower word line 116D-L and the fourth upper word line 116D-U of the fourth pair of odd word lines 116D may respectively be connected to first transistors 120A (FIG. 3) and second transistors 120B (FIG. 3) of additional memory cells 120 (FIG. 3) within the second memory deck 102B (FIG. 3) of the 3D memory array 103 (FIG. 3).

With continued reference to FIG. 6, for each pair of the odd word lines 116 (e.g., each of the first pair of odd word lines 116A, the second pair of odd word lines 116B, the third pair of odd word lines 116C, and the fourth pair of odd word lines 116D) by way of a conductive connection structure 146. For example, as shown in FIG. 6, the first lower word line 116A-L and the first upper word line 116A-U of the first pair of odd word lines 116A may be shorted together by way of a first conductive connection structure 146A; the second lower word line 116B-L and the second upper word line 116B-U of the second pair of odd word lines 116B may be shorted together by way of a second conductive connection structure 146B; the third lower word line 116C-L and the third upper word line 116C-U of the third pair of odd word lines 116C may be shorted together by way of a third conductive connection structure 146C; and the fourth lower word line 116D-L and the fourth upper word line 116D-U of the fourth pair of odd word lines 116D may be shorted together by way of a fourth conductive connection structure 146D. Shorting the lower word line and upper word line of each pair of odd word lines 116 has no effect on the respective functions (e.g., electrical functions) of thereof since the first transistors 120A (FIG. 3) and the second transistors 120B (FIG. 3) of the memory cells 120 (FIG. 3) connected to the pairs of the odd word lines 116 utilize the same signal. However, shorting the lower word line and the upper word line of each pair of odd word lines 116 advantageously facilitates a reduction in the amount and lateral area of conductive material needed to electrically connect the lower word line and the upper word line of each pair of odd word lines 116 to the odd word line drivers 130 (FIG. 2) of the apparatus 100 (FIG. 2), and may effectuate increased lateral space for additional structures (e.g., additional contact structures), as described in further detail below.

For each of the conductive connection structures 146, a single (e.g., only one) conductive line structure 148 (e.g., a portion of a lower word line, a portion of an upper word line, a portion of the conductive connection structure 146, another conductive structure) may laterally extend between the conductive connection structure 146 and one of the odd word line interconnect structures 134. By way of non-limiting example, as shown in FIG. 6, only a first conductive line structure 148A (e.g., a portion first lower word line 116A-L) may route between the first conductive connection structure 146A and one of the odd word line interconnect structures 134 (e.g., the first upper word line 116A-U may terminate at or proximate the first conductive connection structure 146A); only a second conductive line structure 148B (e.g., a portion of the second upper word line 116B-U) may route between the second conductive connection structure 146B and one of the odd word line interconnect structures 134 (e.g., the second lower word line 116B-L may terminate at or proximate the second conductive connection structure 146B); only a third conductive line structure 148C (e.g., a portion of the third lower word line 116C-L) may route between the third conductive connection structure 146C and one of the odd word line interconnect structures 134 (e.g., the third upper word line 116C-U may terminate at or proximate the third conductive connection structure 146C); and only a fourth conductive line structure 148D (e.g., a portion the fourth upper word line 116D-U) may route between the fourth conductive connection structure 146D and one of the odd word line interconnect structures 134 (e.g., the fourth lower word line 116D-L may terminate at or proximate the fourth conductive connection structure 146D).

For each vertical stack (e.g., the first vertical stack, the second vertical stack) of the odd word lines 116, the conductive line structures 148 routing between the conductive connection structures 146 and the odd word line interconnect structures 134 may be substantially laterally aligned with one another. For example, the second conductive line structure 148B laterally extending to one of the odd word line interconnect structures 134 may vertical overlie and be substantially laterally aligned with the portion of the first conductive line structure 148A laterally extending to another one of the odd word line interconnect structures 134; and the fourth conductive line structure 148D laterally extending to an additional one of the odd word line interconnect structures 134 may vertical overlie and be substantially laterally aligned with the third conductive line structure 148C laterally extending to a further one of the odd word line interconnect structures 134.

With continued reference to FIG. 6, additional interconnect structures 144 may be located within lateral spaces between portions of laterally-neighboring vertical stacks of the conductive line structures 148. For example, as shown in FIG. 6, the additional interconnect structures 144 may be provided laterally between a first vertical stack including the first conductive line structure 148A and the second conductive line structure 148B and a second vertical stack including the third conductive line structure 148C and the fourth conductive line structure 148D. The additional interconnect structures 144 may vertically extend to the base structure 104 (FIGS. 1-3) underlying the memory structure 101 (FIGS. 1-3), and may, for example, comprise one or more of ground contacts, supply voltage ($V_{cc}$) contacts, sense amplifier signal contacts, word line driver signal contacts, and p-well contacts. The positions of the additional interconnect structures 144 are at least partially facilitated by the lateral space saved through the combination of shorting the pairs of the odd word lines 116 (e.g., the first pair of odd word lines 116A, the second pair of odd word lines 116B, the third pair of odd word lines 116C, the fourth pair of odd word lines 116D), the use of a single (e.g., only one) conductive line structure 148 to connect each pair of the odd word lines 116 to the odd word line interconnect structures 134, and the lateral alignment of conductive line structure 148 within the same vertical stack as one another.

With returned reference to FIG. 2, word line termination regions for different even word lines 118 within a 3D memory array 103 (FIGS. 1-3) of the memory structure 101 (FIGS. 1 and 2) may be exhibit configurations (including arrangements of and connections between the even word lines 118 and the even word line interconnect structures 136) substantially similar to those of the word line termination regions for the different odd word lines 116 described above with reference to FIG. 6.

With returned reference to FIG. 1, the base structure 104 underlying the memory structure 101 may exhibit a layout (e.g., arrangement, floor plan) of the various components thereof (e.g., sense amplifiers, word line drives, interconnect structures, contacts, lines, other structures, openings) facilitating the configuration of each of the 3D memory arrays 103 (including the configurations of the various components thereof, such as the memory cells 120, the digit lines 108, the word lines 114) previously described with reference to FIGS. 1 through 6. Some such layouts of the base structure 104 are described in further detail below.

Figure 7:
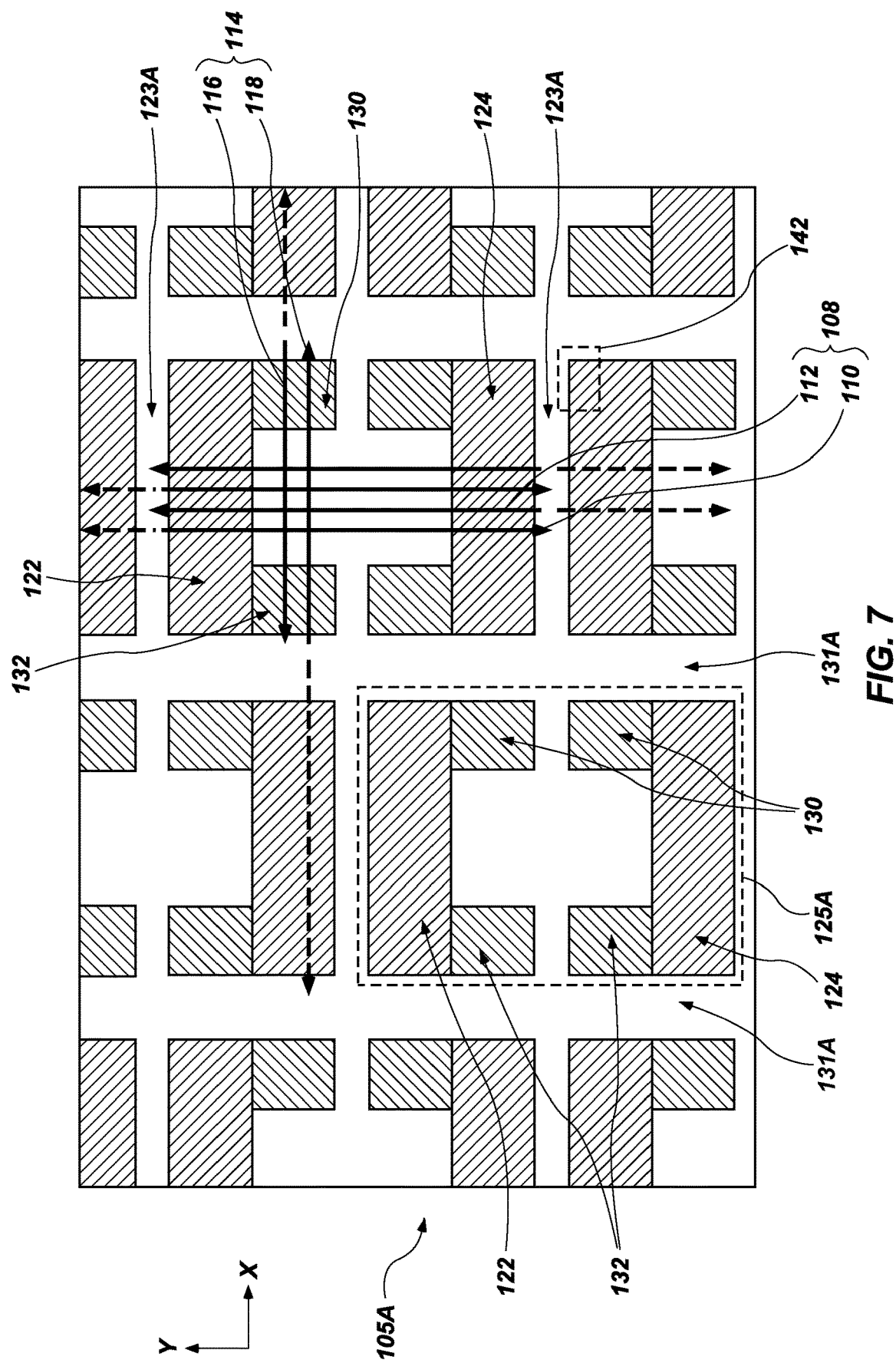
FIG. 7 is a simplified plan view of an orthogonal quilt layout of the base structure of the apparatus shown in FIG. 1, in accordance with embodiments of the disclosure.

FIG. 7 shows a simplified plan view of an orthogonal quilt layout 105A of the base structure 104 (FIGS. 1-3), in accordance with embodiments of the disclosure. As shown in FIG. 7, the orthogonal quilt layout 105A includes first linear openings 123A laterally extending to parallel to one another and in substantially the same direction (e.g., the X-direction) as the word lines 114 of the 3D memory arrays 103 (FIGS. 1-3) thereover, and second linear openings 131A laterally extending parallel to one another and substantially orthogonal to the first linear openings 123A (e.g., in substantially the same direction, such as the Y-direction, as the digit lines 108 of the 3D memory arrays (FIGS. 1-3) thereover). Pairs of the first linear openings 123A and pairs of the second linear openings 131A may laterally bound and define tiles 125A (shown with dashed lines in FIG. 7). The tiles 125A may be laterally staggered (e.g., laterally offset, laterally unaligned) in the direction (e.g., the X-direction) of the first linear openings 123A, and may each individually include a region of odd sense amplifiers 122, a region of even sense amplifiers 124, at least two regions of odd word line drivers 130, and at least two regions of even word line drivers 132. The at least two regions of the odd word line drivers 130 and the at least two regions of the even word line drivers 132 may be positioned laterally between the (e.g., in the Y-direction) the region of the odd sense amplifiers 122 and the region of the even sense amplifiers 124. For each of the tiles 125A, an additional first linear opening 123B (e.g., in addition to the pair of first linear openings 123A bounding and partially defining the tile 125A) may laterally intervene between (e.g., in the Y-direction) and separate the at least two regions of the odd word line drivers 130 and may laterally intervene between (e.g., in the Y-direction) and separate the at least two regions of the even word line drivers 132. The additional first linear opening 123B within the tile 125A may effectuate a break in the lateral continuity of the 3D memory array 103 (FIGS. 1-3) overlying the tile 125A.

With continued reference to FIG. 7, the first linear openings 123A may laterally contain digit line interconnect structures (e.g., the odd digit line interconnect structures 126 and the even digit line interconnect structures 128 previously described with reference to FIGS. 2-5) vertically extending to the digit lines 108, as well as column select routing for the memory decks 102 (FIGS. 1-3). For each of the tiles 125A, one of the first linear openings 123A positioned laterally adjacent the region of the odd sense amplifiers 122 may laterally contain the odd digit line interconnect structures 126 (FIGS. 2-5) electrically connecting the odd sense amplifiers 122 to the odd digit lines 110 of a 3D memory array 103 (FIGS. 1-3) operatively associated with the tile 125A; and another of the first linear openings 123A positioned laterally adjacent the region of the even sense amplifiers 124 may laterally contain the even digit line interconnect structures 128 (FIGS. 2 and 3) electrically connecting the even sense amplifiers 124 to the even digit lines 112 of the 3D memory array 103 (FIGS. 1-3). The odd digit lines 110 may route from the odd digit line interconnect structures 126 (FIGS. 2-5), and the even digit lines 112 may route from the even digit line interconnect structures 128 (FIGS. 2 and 3). Odd sense amplifiers 122 and even sense amplifiers 124 within each of the tiles 125A may be operatively associated with (e.g., shared by) laterally-neighboring 3D memory arrays 103 (FIGS. 1-3) (e.g., a 3D memory array 103 overlying the tile 125A, and another 3D memory array 103 laterally-neighboring the 3D memory array 103 in the Y-direction) of the memory structure 101 (FIG. 1-3), as indicated by the solid and dashed portions of the odd digit lines 110 and the even digit lines 112.

The second linear openings 131A may laterally contain word line interconnect structures (e.g., the odd word line interconnect structures 134 and the even word line interconnect structures 136 previously described with reference to FIGS. 2 and 6) vertically extending to the word lines 114, as well as additional contact structures (e.g., the additional interconnect structures 144 previously described with reference to FIG. 6). For each tile 125A, one of the second linear openings 131A positioned laterally adjacent the regions of the odd word line drivers 130 may laterally contain the odd word line interconnect structures 134 (FIGS. 2 and 6) electrically connecting the odd word line drivers 130 to the odd word lines 116 of a 3D memory array 103 (FIGS. 1-3) operatively associated with the tile 125A; and another of the second linear openings 131A positioned laterally adjacent the regions of the even word line drivers 132 may laterally contain the even word line interconnect structures 136 (FIG. 2) electrically connecting the even word line drivers 132 to the even word lines 118 of the 3D memory array 103 (FIGS. 1-3). The odd word lines 116 may route from the odd word line interconnect structures 134 (FIG. 2), and the even word lines 118 may route from the even word line interconnect structures 136 (FIG. 2). Odd word line drivers 130 and even word line drivers 132 within each of the tiles 125A may be operatively associated with (e.g., shared by) laterally-neighboring 3D memory arrays 103 (FIGS. 1-3) (e.g., a 3D memory array 103 overlying the tile 125A, and another 3D memory array 103 laterally-neighboring the 3D memory array 103 in the X-direction) of the memory structure 101 (FIG. 1-3), as indicated by the solid and dashed portions of the odd word lines 116 and the even word lines 118.

The orthogonal quilt layout 105A of the base structure 104 (FIGS. 1-3) may exhibit a smaller overall lateral dimensions than a non-quilted layout of the base structure 104 (FIGS. 1-3) for the same quantities and configurations of the memory cells 120 (FIGS. 2 and 3) of the memory structure 101 (FIG. 103) overlying the base structure 104 (FIGS. 1-3). The example, the orthogonal quilt layout 105A may exhibit smaller overall lateral dimension (e.g., width) in the direction of the first linear openings 123A than a non-quilted layout, such the overall lateral area of the orthogonal quilt layout 105A is smaller than that of the non-quilted layout. In some embodiments, the overall lateral area of the orthogonal quilt layout 105A is about twenty-two (22) percent smaller than that of a non-quilted layout. The configuration of the orthogonal quilt layout 105A also facilitates an interface between the word line drivers (e.g., the odd word line drivers 130, and the even word line drivers 132) of each tile 125A thereof and the 3D memory array 103 (FIGS. 1-3) overlying the tile 125A.

Figure 8:
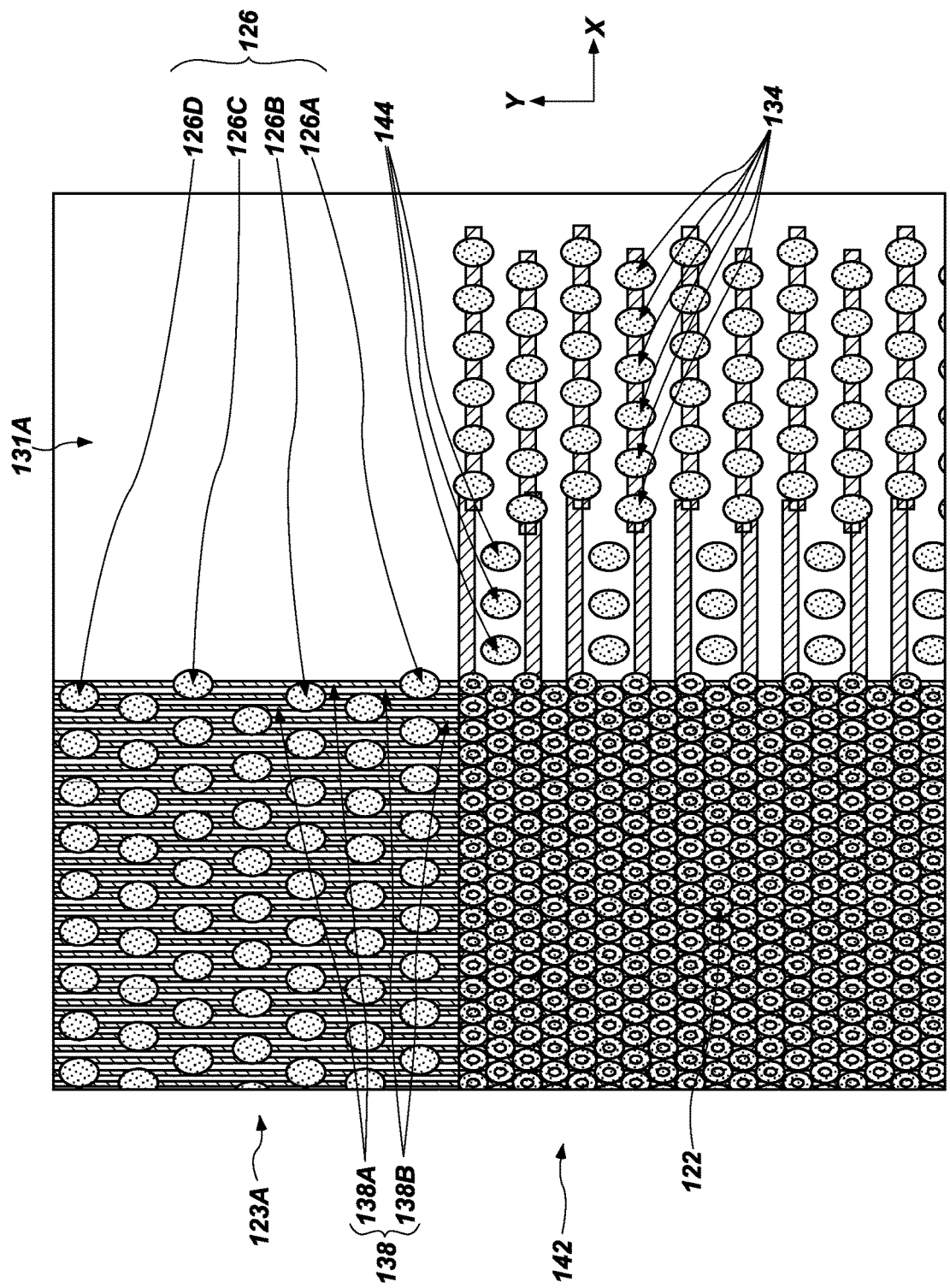
FIG. 8 is a simplified plan view showing a portion of the orthogonal quilt layout shown in FIG. 7 in more detail.

FIG. 8 is a simplified plan view showing a portion 142 of the orthogonal quilt layout 105A shown in FIG. 7 in more detail. As shown in FIG. 8, the odd digit line interconnect structures 126 previously described with reference to FIGS. 2 and 3 may be located within the first linear openings 123A positioned laterally adjacent (e.g., in the Y-direction) the regions of the odd sense amplifiers 122. The odd digit line interconnect structures 126 may be connected to the odd base digit lines 138 connected to the odd sense amplifiers 122, and may also be connected to the odd digit lines 110 (FIGS. 2 and 3) of the memory structure 101 (FIGS. 1-3). Pairs of the odd base digit lines 138 may be connected to groups of the odd digit line interconnect structures 126 connected to different vertical stacks of the odd digit lines 110 (FIG. 3). By way of non-limiting example, a first odd base digit line 138A of a first pair of the odd base digit lines 138 may be connected to a first odd digit line interconnect structure 126A and a third odd digit line interconnect structure 126C, which may respectively be connected to a first odd digit line 110A (FIG. 3) and a third odd digit line 110C (FIG. 3) of a first vertical stack of the odd digit lines 110 (FIG. 3) in the manner previously discussed with reference to FIGS. 3-5; and a second odd base digit line 138B of the first pair of the odd base digit lines 138 may be connected to a second odd digit line interconnect structure 126B and a fourth odd digit line interconnect structure 126D, which may respectively be connected to a second odd digit line 110B (FIG. 2) and a fourth odd digit line 110D of the first vertical stack of the odd digit lines 110 (FIG. 3) in the manner previously discussed with reference to FIGS. 3-5.

In addition, odd word line interconnect structures 134 may be located within the second linear openings 131A positioned laterally adjacent (e.g., in the X-direction) the regions of the odd sense amplifiers 122. The odd word line interconnect structures 134 may be connected to odd word line drivers 130 (FIG. 7), and may also be connected to the odd word lines 116 (FIGS. 2 and 6) of the memory structure 101 (FIGS. 1-3). Different groups of the odd word line interconnect structures 134 may be connected to different vertical stacks of the odd word lines 116 (FIG. 2) within the 3D memory arrays 103 (FIGS. 1-3) of the memory structure 101 (FIGS. 1-3), as previously described with reference to FIG. 6. For example, different odd word line interconnect structures 134 within an individual row (e.g., extending in the X-direction) of the odd word line interconnect structures 134 may individually be connected to different pairs (e.g., the first pair of odd word lines 116A and the second pair of odd word lines 116B) of odd word lines 116 (FIG. 6) located at different vertical positions than one another within an individual vertical stack (e.g., the first vertical stack) of the odd word lines 116 (FIG. 6).

As shown in FIG. 8, the additional interconnect structures 144 may be located within the second linear openings 131A. The additional interconnect structures 144 may be positioned laterally between the odd sense amplifiers 122 and odd word line interconnect structures 134 in a first lateral direction (e.g., the X-direction), and may be positioned laterally between different groups (e.g., rows) of the odd word line interconnect structures 134 in a second lateral direction (e.g., the Y-direction). As previously discussed with reference to FIG. 6, the presence and lateral positions of the additional interconnect structures 144 may be facilitated by the configurations of the connections between the odd word line interconnect structures 134 and the odd word lines 116 (FIG. 2) operatively associated with the memory cells 120 (FIGS. 2 and 3) of the different memory decks 102 (FIGS. 1-3) of the 3D memory arrays 103 (FIGS. 1-3) of the memory structure 101 (FIGS. 1-3).

Other portions of the orthogonal quilt layout 105A (FIG. 7) may exhibit similar features and relative feature arrangements to those of the portion 142 shown in FIG. 8. For example, referring again to FIG. 7, first linear openings 123A positioned laterally adjacent (e.g., in the Y-direction) the regions of the even sense amplifiers 124 may individually include even digit line interconnect structures 128 (FIGS. 2 and 3) individually connected to even digit lines 112 (FIGS. 2 and 3) and even base digit lines 140 (FIG. 2) coupled to the even sense amplifiers 124 in a manner similar to that previously described with respect to how the odd digit line interconnect structures 126 are individually connected to the odd digit lines 110 (FIGS. 2 and 3) and the odd base digit lines 138 (FIG. 8) coupled to the odd sense amplifiers 122 (FIG. 8). In addition, second linear openings 131A positioned laterally adjacent (e.g., in the X-direction) the regions of the even sense amplifiers 124 may individually include even word line interconnect structures 136 (FIG. 2) individually connected to even word lines 118 (FIG. 2) and even word line drivers 132 (FIG. 2) in a manner similar to that previously described with respect to how the odd word line interconnect structures 134 (FIG. 8) are individually connected to the odd word lines 116 (FIGS. 2 and 6) and the odd word line drivers 130. Furthermore, the second linear openings 131A positioned laterally adjacent (e.g., in the X-direction) the regions of the even sense amplifiers 124 may also include additional contacts substantially similar to the additional interconnect structures 144, wherein such additional contacts are located laterally between the even sense amplifiers 124 and the even word line interconnect structures 136 (FIG. 2) in a first lateral direction (e.g., the X-direction), and are also located laterally between different groups (e.g., rows) of the even word line interconnect structures 136 (FIG. 2) in a second lateral direction (e.g., the Y-direction).

Figure 9:
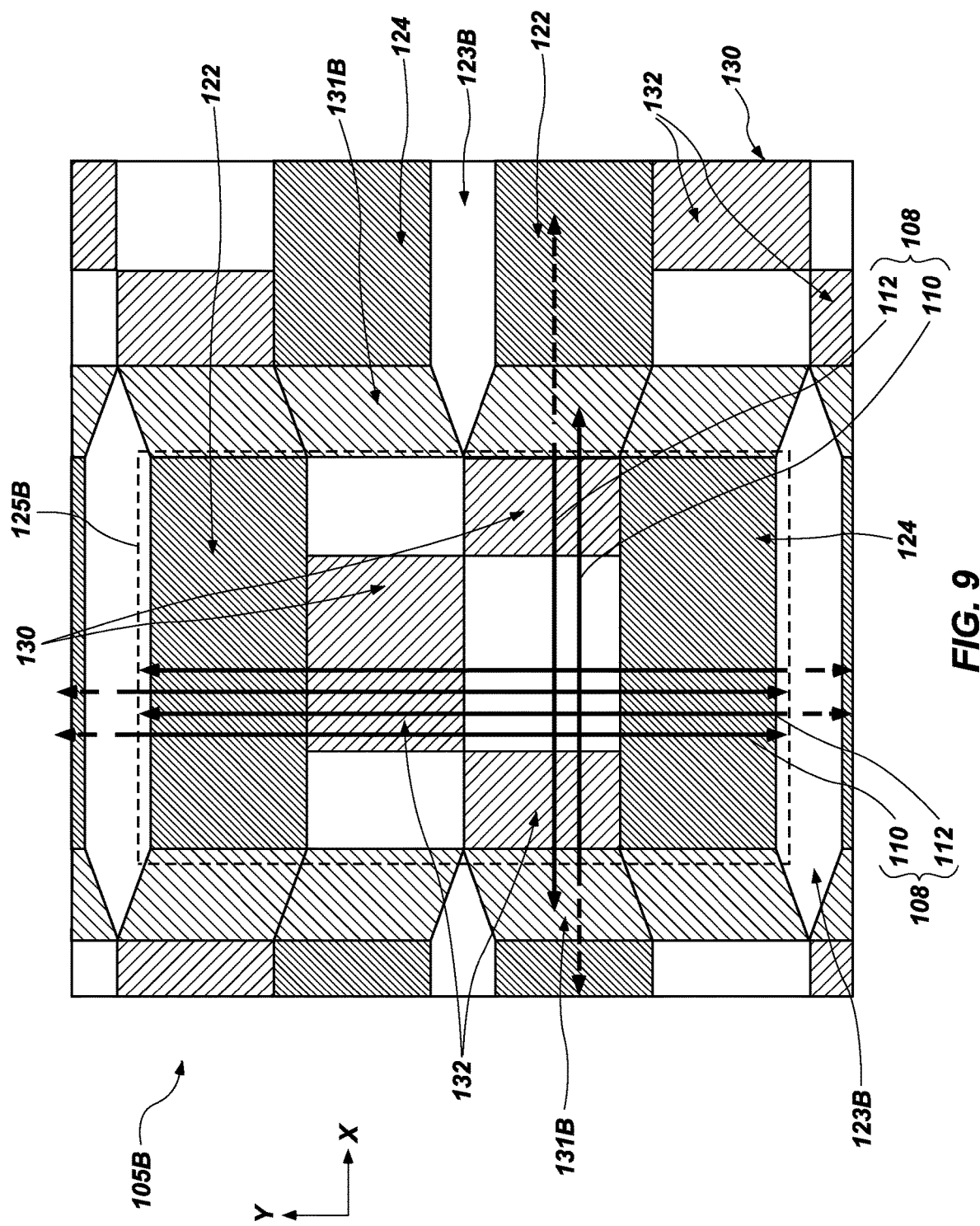
FIG. 9 is a simplified plan view of a woven quilt layout of the base structure of the apparatus shown in FIG. 1, in accordance with additional embodiments of the disclosure.

FIG. 9 shows a simplified plan view of a woven quilt layout 105B of the base structure 104 (FIGS. 1-3), in accordance with additional embodiments of the disclosure. As shown in FIG. 9, the woven quilt layout 105B includes first linear openings 123B laterally extending to parallel to one another and in substantially the same direction (e.g., the X-direction) as the word lines 114 of the 3D memory arrays (FIGS. 1-3) thereover, and second linear openings 131B laterally extending parallel to one another and substantially orthogonal to the first linear openings 123B (e.g., in substantially the same direction, such as the Y-direction, as the digit lines 108 of the 3D memory arrays (FIGS. 1-3) thereover). Pairs of the first linear openings 123B and pairs of the second linear openings 131B may laterally bound and define tiles 125B (shown with dashed lines in FIG. 9). The tiles 125B may be laterally staggered (e.g., laterally offset, laterally unaligned) in the direction (e.g., the X-direction) of the first linear openings 123B, and may each individually include a region of odd sense amplifiers 122, a region of even sense amplifiers 124, at least two regions of odd word line drivers 130, and at least two regions of even word line drivers 132. The at least two regions of the odd word line drivers 130 and the at least two regions of the even word line drivers 132 may be positioned laterally between the (e.g., in the Y-direction) the region of the odd sense amplifiers 122 and the region of the even sense amplifiers 124.

Unlike the orthogonal quilt layout 105A (FIG. 7), the woven quilt layout 105B is configured such that the tiles 125B thereof are free of additional first linear openings 123B (e.g., in addition to the pairs of first linear openings 123B bounding and partially defining the tiles 125B) laterally intervening between (e.g., in the Y-direction) and separating the regions of the odd word line drivers 130 and laterally intervening between (e.g., in the Y-direction) and separating the regions of the even word line drivers 132. As shown in FIG. 9, each of the first linear openings 123B of the woven quilt layout 105B partially defining the lateral boundaries (e.g., boundaries in the Y-direction) of each of the tiles 125B may terminate at or before the lateral boundaries (e.g., in the Y-direction) of each other tile 125B laterally adjacent thereto. Put another way, the first linear openings 123B of the woven quilt layout 105B may laterally extend (e.g., in the X-direction) discontinuously, such that the first linear openings 123B do not laterally extend through middle regions of the tiles 125B of the woven quilt layout 105B. As a result of the omission (e.g., absence) of additional first linear openings 123B laterally extending through middle regions of each of the tiles 125B (e.g., as compared to the additional first linear openings 123A extending laterally extending through middle regions of each of the tiles 125A of the orthogonal quilt layout 105A previously described with reference to FIG. 7), the 3D memory arrays 103 (FIGS. 1-3) overlying the tiles 125B may each individually be substantially free of breaks in the lateral continuity thereof.

With continued reference to FIG. 9, the first linear openings 123B may laterally contain digit line interconnect structures (e.g., the odd digit line interconnect structures 126 and the even digit line interconnect structures 128 previously described with reference to FIGS. 2-5) vertically extending to the digit lines 108, as well as column select routing for the memory decks 102 (FIGS. 1-3). For each of the tiles 125B, one of the first linear openings 123B positioned laterally adjacent the region of the odd sense amplifiers 122 may laterally contain the odd digit line interconnect structures 126 (FIGS. 2-5) electrically connecting the odd sense amplifiers 122 to the odd digit lines 110 of a 3D memory array 103 (FIGS. 1-3) operatively associated with the tile 125B; and another of the first linear openings 123B positioned laterally adjacent the region of the even sense amplifiers 124 may laterally contain the even digit line interconnect structures 128 (FIGS. 2 and 3) electrically connecting the even sense amplifiers 124 to the even digit lines 112 of the 3D memory array 103 (FIGS. 1-3). Odd digit lines 110 may route from the odd digit line interconnect structures 126 (FIGS. 2-5), and the even digit lines 112 may route from the even digit line interconnect structures 128 (FIGS. 2 and 3). Odd sense amplifiers 122 and even sense amplifiers 124 within each of the tiles 125B may be operatively associated with (e.g., shared by) laterally-neighboring 3D memory arrays 103 (FIGS. 1-3) (e.g., a 3D memory array 103 overlying the tile 125B, and another 3D memory array 103 laterally-neighboring the 3D memory array 103 in the Y-direction) of the memory structure 101 (FIG. 1-3), as indicated by the solid and dashed portions of the odd digit lines 110 and the even digit lines 112.

The second linear openings 131B may laterally contain word line interconnect structures (e.g., the odd word line interconnect structures 134 and the even word line interconnect structures 136 previously described with reference to FIGS. 2 and 6) vertically extending to the word lines 114, as well as additional contact structures (e.g., the additional interconnect structures 144 previously described with reference to FIG. 6). For each tile 125B, one of the second linear openings 131B positioned laterally adjacent at least one of the regions of the odd word line drivers 130 may laterally contain the odd word line interconnect structures 134 (FIGS. 2 and 6) electrically connecting the odd word line drivers 130 to the odd word lines 116 of a 3D memory array 103 (FIGS. 1-3) operatively associated with the tile 125B; and another of the second linear openings 131B positioned laterally adjacent at least one of the regions of the even word line drivers 132 may laterally contain the even word line interconnect structures 136 (FIG. 2) electrically connecting the even word line drivers 132 to the even word lines 118 of the 3D memory array 103 (FIGS. 1-3). The odd word lines 116 may route from the odd word line interconnect structures 134 (FIGS. 2 and 6), and the even word lines 118 may route from the even word line interconnect structures 136 (FIG. 2). Odd word line drivers 130 and even word line drivers 132 within each of the tiles 125B may be operatively associated with (e.g., shared by) laterally-neighboring 3D memory arrays 103 (FIGS. 1-3) (e.g., a 3D memory array 103 overlying the tile 125B, and another 3D memory array 103 laterally-neighboring the 3D memory array 103 in the X-direction) of the memory structure 101 (FIGS. 1-3), as indicated by the solid and dashed portions of the odd word lines 116 and the even word lines 118.

The woven quilt layout 105B of the base structure 104 (FIGS. 1-3) may exhibit a smaller overall lateral dimensions than the orthogonal quilt layout 105A (FIG. 7) of the base structure 104 (FIGS. 1-3) for the same quantities and configurations of the memory cells 120 (FIGS. 2 and 3) of the memory structure 101 (FIG. 103) overlying the base structure 104 (FIGS. 1-3). The example, the woven quilt layout 105B may exhibit one or more smaller overall lateral dimensions (e.g., in the Y-direction) than the orthogonal quilt layout 105A (FIG. 7). Accordingly, the overall lateral area of the woven quilt layout 105B is smaller than that the orthogonal quilt layout 105A (FIG. 7). In some embodiments, the overall lateral area of the woven quilt layout 105B is about twenty-nine (29) percent smaller than that of a non-quilted layout of the base structure 104 (FIGS. 1-3). The configuration of the woven quilt layout 105B also facilitates an interface between the word line drivers (e.g., the odd word line drivers 130, and the even word line drivers 132) of each tile 125B thereof and the 3D memory array 103 (FIGS. 1-3) overlying the tile 125B.

Figure 10:
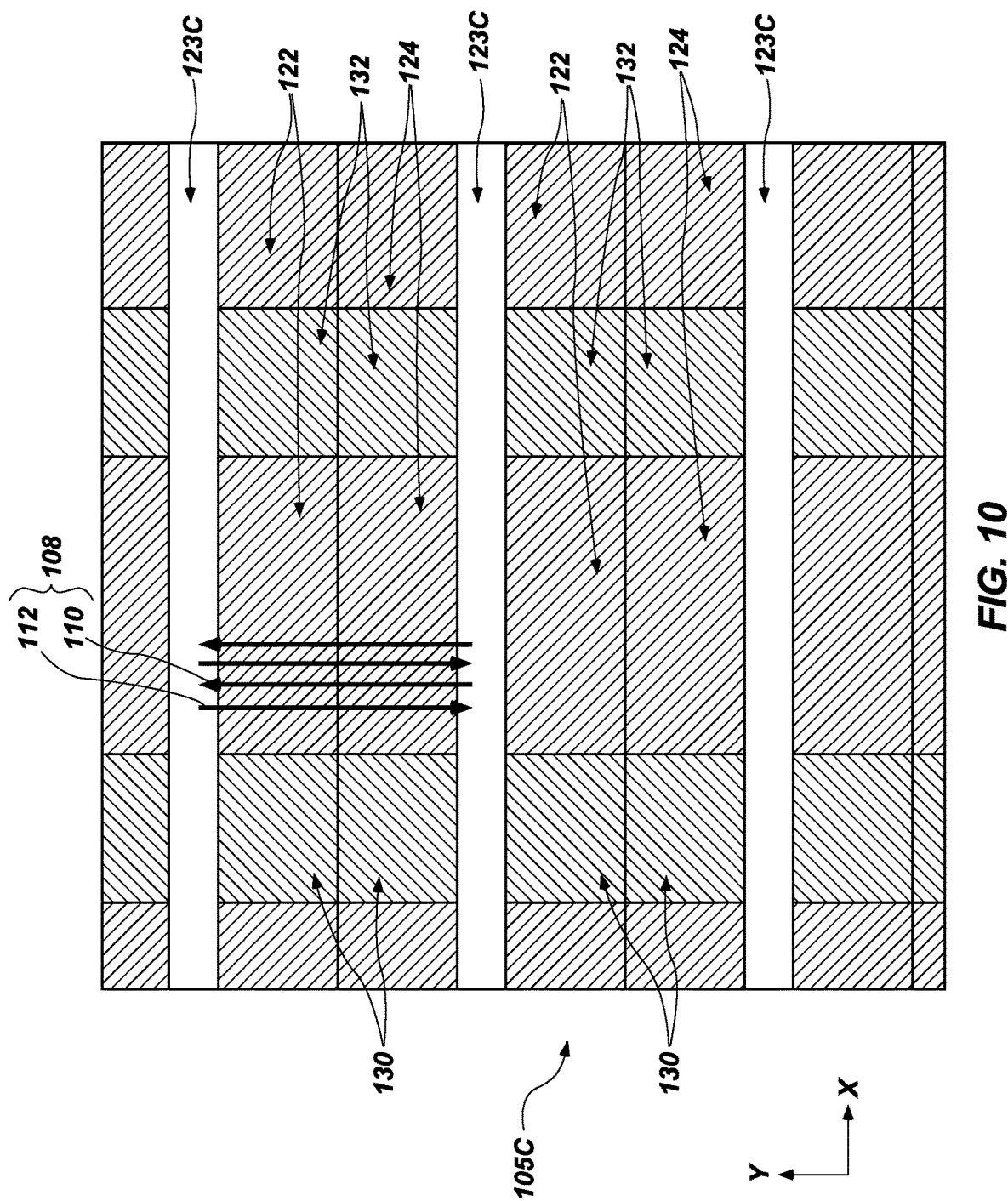
FIG. 10 is a simplified plan view of a non-quilted layout of the base structure of the apparatus shown in FIG. 1, in accordance with further embodiments of the disclosure.

FIG. 10 shows a simplified plan view of a non-quilted layout 105C of the base structure 104 (FIGS. 1-3), in accordance with further embodiments of the disclosure. As shown in FIG. 10, the non-quilted layout 105C may include first linear openings 123C laterally extending in a direction (e.g., the X-direction) perpendicular to a direction (e.g., the Y-direction) in which the digit lines 108 of the 3D memory array 103 (FIGS. 1-3) extend. In addition, regions of odd sense amplifiers 122, regions of even sense amplifiers 124, regions of odd word line drivers 130, and regions of even word line drivers 132 may be positioned laterally between (e.g., in the Y-direction) pairs of the first linear openings 123C. Each region of odd sense amplifiers 122 may be positioned laterally adjacent (e.g., in the Y-direction) a region of the even sense amplifiers 124; and each region of odd word line drivers 130 may be positioned laterally adjacent (e.g., in the Y-direction) a region of the even word line drivers 132. Laterally adjacent (e.g., in the Y-direction) regions of the odd word line drivers 130 and the even word line drivers 132 may laterally intervene (e.g., in the X-direction) between and separate pairs of lateral adjacent (e.g., in the Y-direction) regions of the odd sense amplifiers 122 and the even sense amplifiers 124. Put another way, laterally adjacent (e.g., in the Y-direction) regions of the odd word line drivers 130 and the even word line drivers 132 may laterally alternate (e.g., in the X-direction) with laterally adjacent (e.g., in the Y-direction) regions of the odd sense amplifiers 122 and the even sense amplifiers 124.

The first linear openings 123C may laterally contain digit line interconnect structures (e.g., the odd digit line interconnect structures 126 and the even digit line interconnect structures 128 previously described with reference to FIGS. 2-5) vertically extending to the digit lines 108, as well as column select routing for the memory decks 102 (FIGS. 1-3) of each of the 3D memory arrays 103 (FIGS. 1-3) of the memory structure 101 (FIGS. 1-3). One of the first linear openings 123C positioned laterally adjacent the region of the odd sense amplifiers 122 may laterally contain the odd digit line interconnect structures 126 (FIGS. 2-5) electrically connecting the odd sense amplifiers 122 to the odd digit lines 110; and another of the first linear openings 123C positioned laterally adjacent the region of the even sense amplifiers 124 may laterally contain the even digit line interconnect structures 128 (FIGS. 2 and 3) electrically connecting the even sense amplifiers 124 to the even digit lines 112. The odd digit lines 110 may route from the odd digit line interconnect structures 126 (FIGS. 2-5), and the even digit lines 112 may route from the even digit line interconnect structures 128 (FIGS. 2 and 3).

Thus, an apparatus according to embodiments of the disclosure comprises base structure, a memory structure, and digit line interconnect structures. The base structure comprises odd sense amplifiers and even sense amplifiers. The memory structure vertically overlies the base structure and comprises 3D memory arrays having decks each individually comprising digit lines, additional digit lines, memory cells, and word lines. The digit lines extend in a first lateral direction and comprise odd digit lines and even digit lines laterally alternating with the odd digit lines. The additional digit lines extend in the first lateral direction and comprise additional odd digit lines and additional even digit lines laterally alternating with the additional odd digit lines. The memory cells vertically extend between and are electrically connected to the digit lines and the additional digit lines. Each of the memory cells comprises a first transistor, a second transistor, and a capacitor vertically between the first transistor and the second transistor. The word lines are electrically connected to the memory cells and extending in a second lateral direction orthogonal to the first lateral direction. The word lines comprise odd word lines and even word lines laterally alternating with the odd word lines. The digit line interconnect structures comprise odd digit line interconnect structures and even digit line interconnect structures. The odd digit line interconnect structures vertically extend between and electrically connect the odd sense amplifiers to the odd digit lines and the additional odd digit lines. The even digit line interconnect structures vertically extend between and electrically connect the even sense amplifiers to the even digit lines and the additional even digit lines.

FIGS. 11A through 11M are simplified partial cross-sectional views illustrating embodiments of a method of forming an apparatus structure, such as one of the memory decks 102 of one of the 3D memory arrays 103 of the memory structure 101 previously described with reference to FIGS. 1 through 3. With the description as provided below, it will be readily apparent to one of ordinary skill in the art that the process described herein may be used in various applications. In other words, the process may be used whenever it is desired to form an apparatus structure including one or more hexagonal transistor arrays.

Figure 11A:
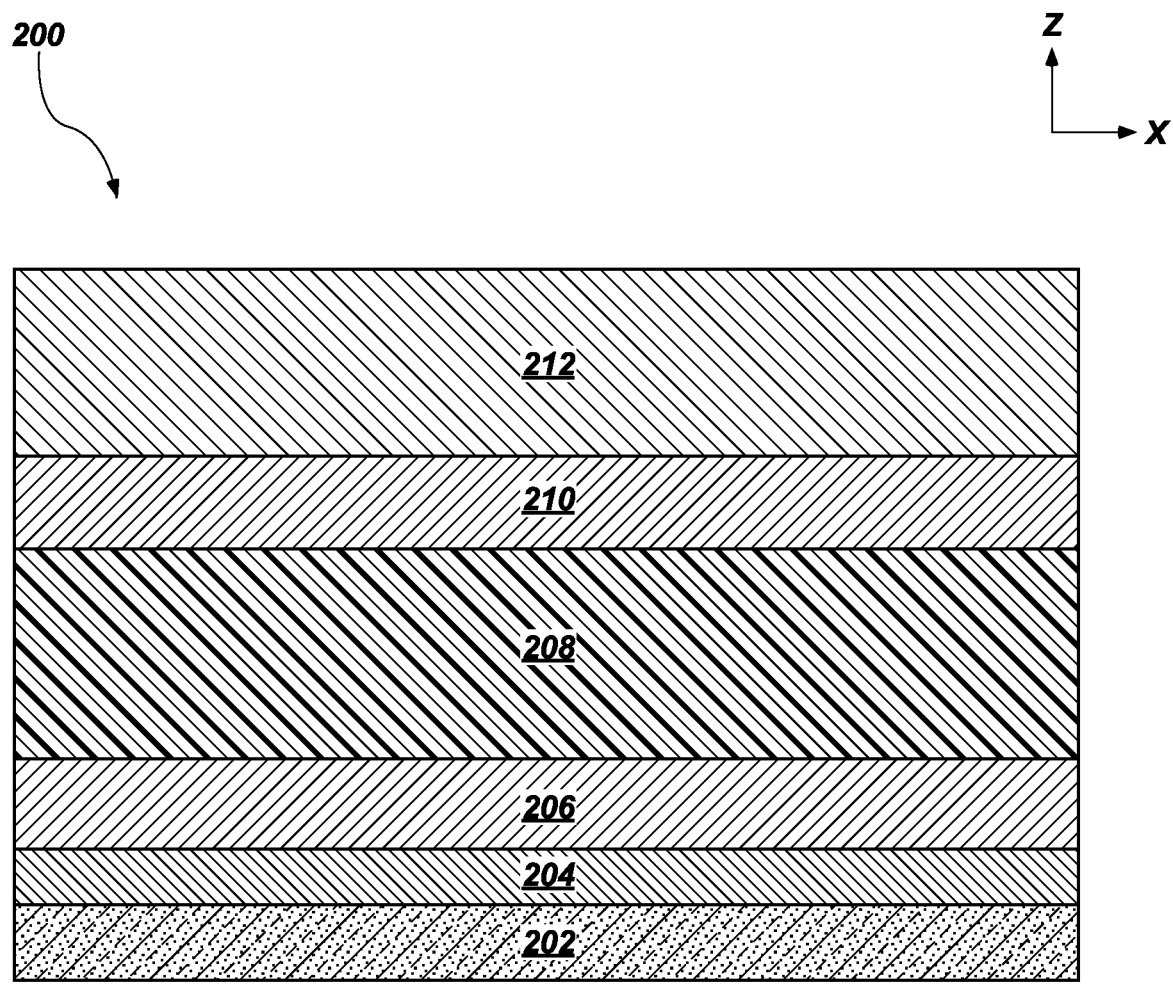
FIGS. 11A through 11N are simplified cross-sectional views illustrating embodiments of a method of forming an apparatus structure, in accordance with embodiments of the disclosure.

Referring to FIG. 11A an apparatus structure 200 includes digit lines 202, digit line contacts 204 on or over the digit lines 202, a first dielectric material 206 on or over the digit line contacts 204, a sacrificial dielectric material 208 on or over the first dielectric material 206, a second dielectric material 210 on or over the sacrificial dielectric material 208, and a sacrificial material 212 on or over the second dielectric material 210. The digit lines 202 may be formed of and include at least one electrically conductive material, such as one or more of a metal, an alloy, a conductive metal oxide, a conductive metal nitride, a conductive metal silicide, and a conductively doped semiconductor material. By way of non-limiting example, the digit lines 202 may be formed of and include one or more of tungsten (W), tungsten nitride (WN), nickel (Ni), tantalum (Ta), tantalum nitride (TaN), tantalum silicide (TaSi), platinum (Pt), copper (Cu), silver (Ag), gold (Au), aluminum (Al), molybdenum (Mo), titanium (Ti), titanium nitride (TiN), titanium silicide (TiSi), titanium silicon nitride (TiSiN), titanium aluminum nitride (TiAlN), molybdenum nitride (MoN), iridium (Ir), iridium oxide ($IrO_x$), ruthenium (Ru), ruthenium oxide ($RuO_x$), and conductively doped silicon. In some embodiments, the digit lines 202 are formed of and include W.

Digit line contacts 204 may be formed of and include at least one N-type conductivity material. The digit line contacts 204 may serve as drain regions of subsequently formed transistors, as described in further detail below. By way of non-limiting example, the N-type conductivity material may comprise polysilicon doped with at least one N-type dopant (e.g., arsenic ions, phosphorous ions, antimony ions).

The first dielectric material 206 may be formed of and include one or more dielectric materials having etch selectivity relative to the sacrificial dielectric material 208. As described in further detail below, portions of the sacrificial dielectric material 208 may be selectively removed relative to the first dielectric material 206 and the second dielectric material 210. By way of non-limiting example, the first dielectric material 206 may comprise an oxide dielectric material, such as one or more of silicon dioxide ($SiO_2$), aluminum oxide ($Al_2O_3$), phosphosilicate glass, borosilicate glass, borophosphosilicate glass, and fluorosilicate glass. In some embodiments, the first dielectric material 206 comprises $SiO_2$. The first dielectric material 206 may be substantially undoped, or may doped.

The sacrificial dielectric material 208 may be formed of and include one or more dielectric materials having etch selectivity relative to the first dielectric material 206 and the second dielectric material 210. By way of non-limiting example, the sacrificial dielectric material 208 may comprise a nitride dielectric material, such as silicon nitride ($Si_3N_4$). In some embodiments, the sacrificial dielectric material 208 comprises $Si_3N_4$.

The second dielectric material 210 may be formed of and include one or more dielectric materials having etch selectivity relative to the sacrificial dielectric material 208. By way of non-limiting example, the second dielectric material 210 may comprise an oxide dielectric material, such as one or more of $SiO_2$, $Al_2O_3$, phosphosilicate glass, borosilicate glass, borophosphosilicate glass, and fluorosilicate glass. A material composition of the second dielectric material 210 may be substantially the same as or may be different than that of the first dielectric material 206. In some embodiments, the second dielectric material 210 comprises $SiO_2$. The second dielectric material 210 may be substantially undoped, or may doped.

The sacrificial material 212 may be formed of and include one or more materials having etch selectivity relative to the second dielectric material 210. As described in further detail below, portions of the sacrificial material 212 may be selectively removed relative to the second dielectric material 210. By way of non-limiting example, the sacrificial material 212 may be formed of and include polysilicon. The sacrificial material 212 may be doped, or may be substantially undoped. In some embodiments, the sacrificial material 212 comprises substantially undoped polysilicon.

Figure 11B:
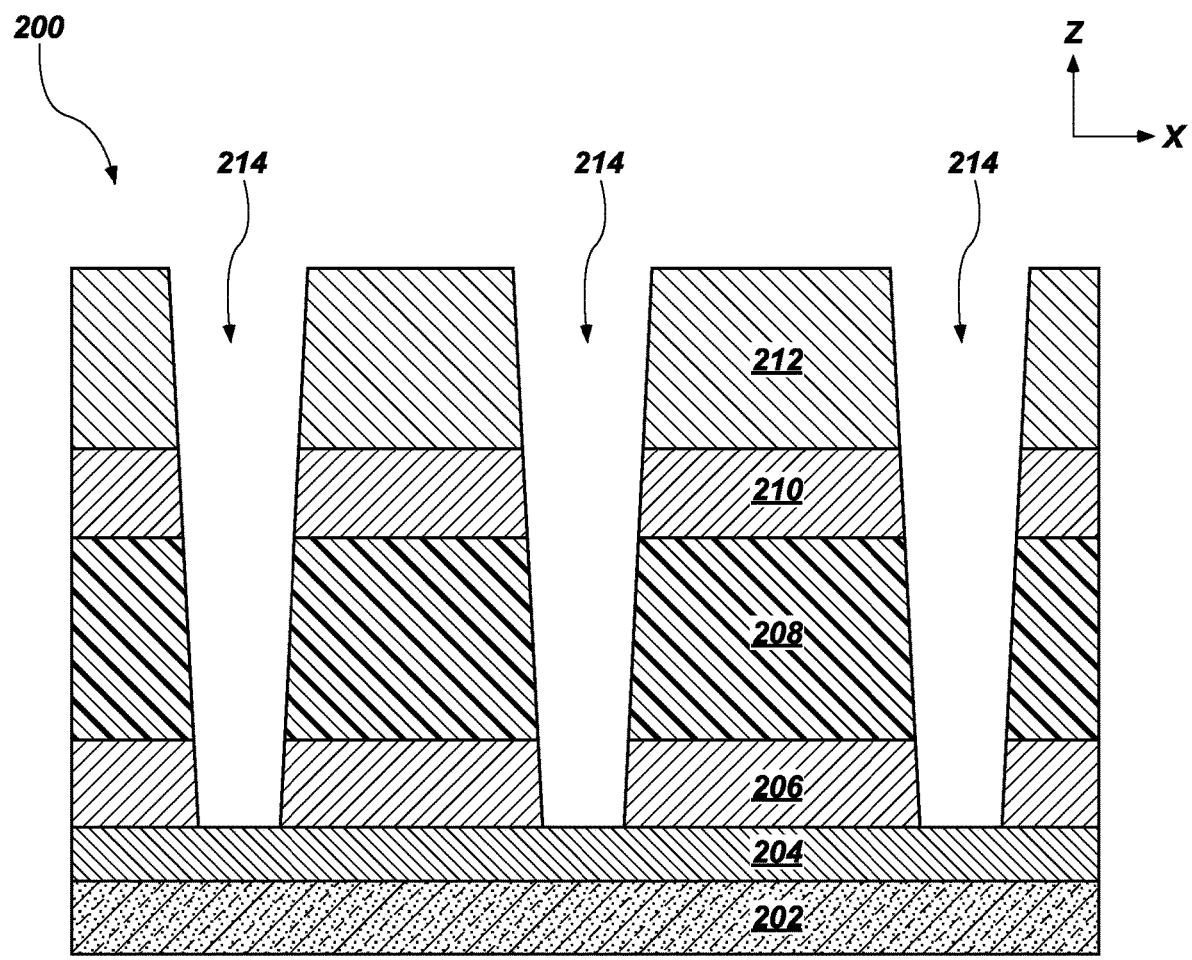

Referring next to FIG. 11B, openings 214 (e.g., vias, apertures, holes) may be formed in and extend through portions of the sacrificial material 212, the second dielectric material 210, the sacrificial dielectric material 208, and the first dielectric material 206. The openings 214 may vertical extend from an upper surface of the sacrificial material 212 to upper surfaces of the digit line contacts 204. The size, shape, and spacing of each of the openings 214 may at least partially depend upon the size, shape, and spacing structures to be formed within the openings 214, as described in further detail below. In some embodiments, the openings 214 each individually exhibit a substantially circular lateral cross-sectional shape. Centers of the openings 214 may be substantially laterally aligned (e.g., in a lateral direction orthogonal to the X-direction shown in FIG. 11B) with centers of the digit line contacts 204 thereunder.

Figure 11C:
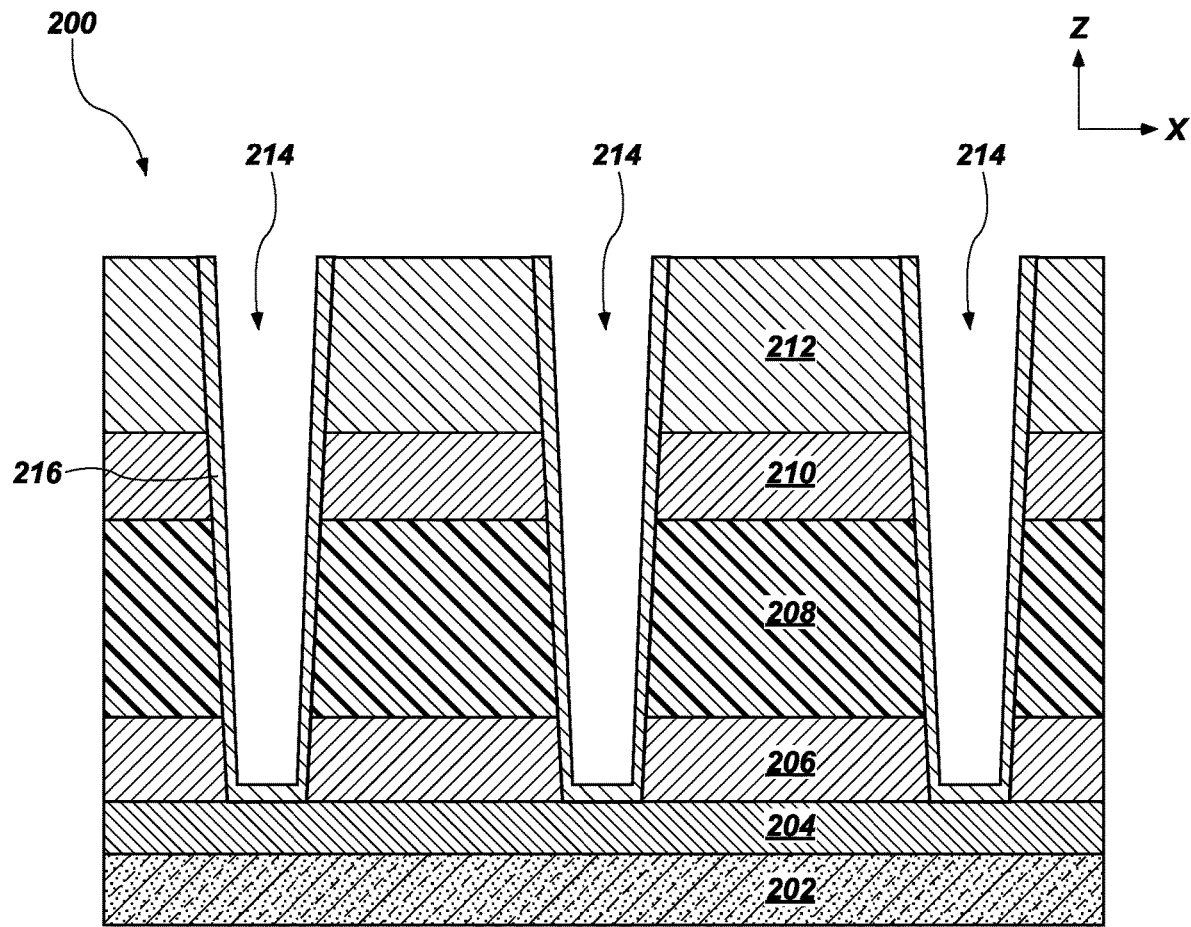

Referring next to FIG. 11C, channel structures 216 may be formed within the openings 214. As shown in FIG. 11C, each of the channel structures 216 may comprise a container-shaped structure including a floor, and at least one sidewall integral and continuous with the floor and at least defining a void space comprising a remaining (e.g., unfilled) portion of the opening 214 associated with the channel structure 216. In some embodiments, the channel structures 216 each include a generally tubular sidewall integral and continuous with a floor. Accordingly, each of the channel structures 216 may exhibit a generally annular lateral cross-sectional shape above the floor thereof.

The channel structures 216 may be formed of and include at least one semiconductive material including, but not limited to, one or more of a silicon material, a silicon-germanium material, a germanium material, a gallium arsenide material, a gallium nitride material, and an indium phosphide material. In some embodiments, the channel structures 216 are formed of and include at least one silicon material. As used herein, the term "silicon material" means and includes a material that includes elemental silicon or a compound of silicon. The channel structures 216 may, for example, be formed of and include monocrystalline silicon, polysilicon, or combinations thereof. The channel structures 216 may be doped, or may be substantially undoped. In some embodiments, the channel structures 216 each comprise substantially undoped polysilicon.

The channel structures 216 may be formed by conformally forming (e.g., conformally depositing through one or more of a PVD process, a CVD process, an ALD process, and a spin-coating process) a semiconductive material on exposed surfaces of the sacrificial material 212, the second dielectric material 210, the sacrificial dielectric material 208, the first dielectric material 206, and the digit line contacts 204 inside and outside of the openings 214, and the removing (e.g., through an abrasive planarization process, such as a CMP process) portions of the semiconductive material outside of the boundaries (e.g., the vertical boundaries, the lateral boundaries) of the openings 214.

Figure 11D:
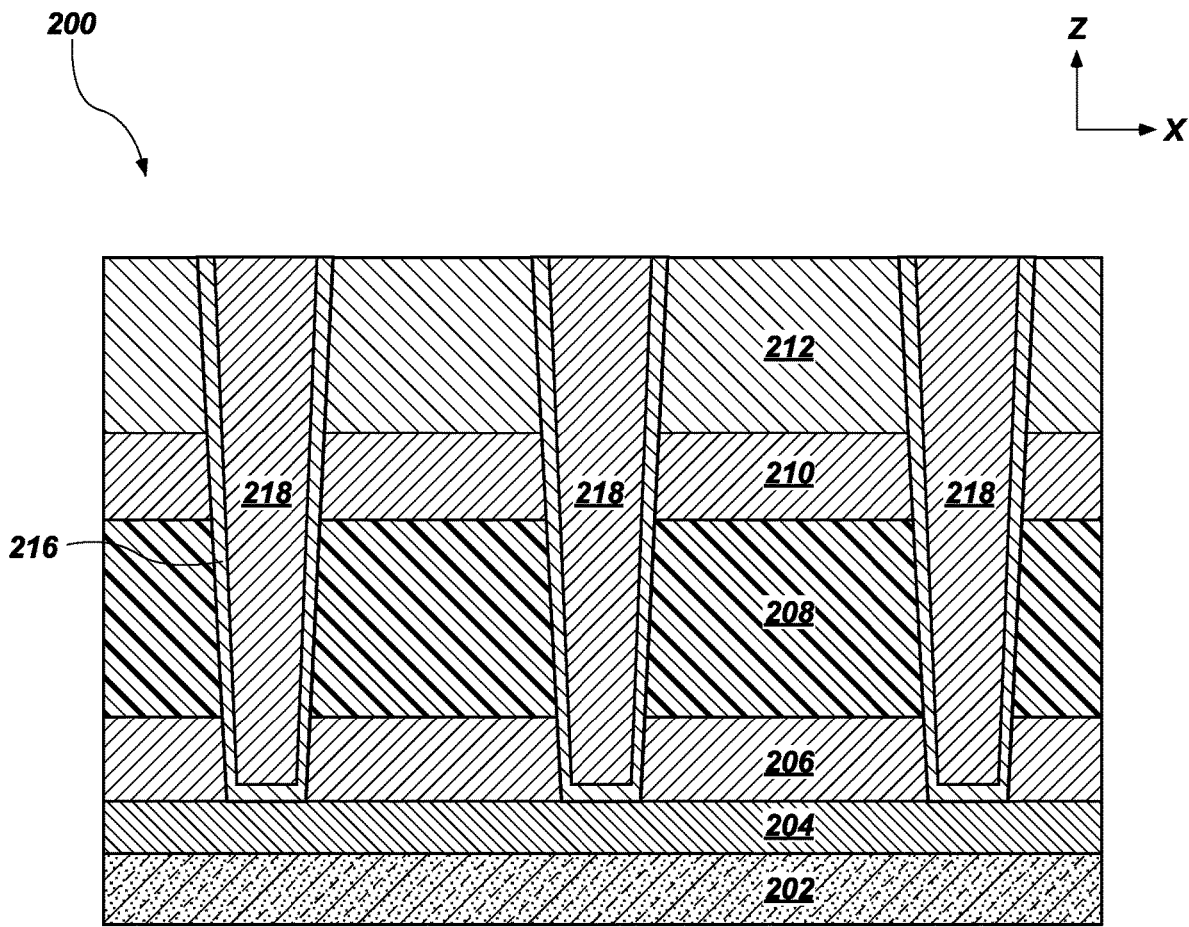

Referring next to FIG. 11D, dielectric structures 218 made be formed within remaining (e.g., unfilled) portions of the openings 214 (FIG. 11C). As shown in FIG. 11D, the dielectric structures 218 may be confined with boundaries (e.g., vertical boundaries, lateral boundaries) of the channel structures 216. The dielectric structures 218 may exhibit sizes, shapes, and spacing corresponding to those of the void spaces previously defined by the channel structure 216. In some embodiments, the dielectric structures 218 comprise pillars exhibiting generally circular lateral cross-sectional shapes.

The dielectric structures 218 may be formed of and include one or more dielectric materials having etch selectivity relative to the sacrificial dielectric material 208. By way of non-limiting example, the dielectric structures 218 may comprise an oxide dielectric material, such as one or more of $SiO_2$, $Al_2O_3$, phosphosilicate glass, borosilicate glass, borophosphosilicate glass, and fluorosilicate glass. A material composition of the dielectric structures 218 may be substantially the same as or may be different than that of one or more (e.g., each) of the first dielectric material 206 and the second dielectric material 210. In some embodiments, the dielectric structures 218 are formed of and include $SiO_2$.

The dielectric structures 218 may be formed by non-conformally forming (e.g., non-conformally depositing through a PVD process) a dielectric material (e.g., an oxide dielectric material) on exposed surfaces of the channel structures 216 and the sacrificial material 212 inside and outside of the openings 214, and then removing (e.g., through an abrasive planarization process, such as a CMP process) portions of the semiconductive material outside of the boundaries (e.g., the vertical boundaries, the lateral boundaries) of the openings 214.

Figure 11E:
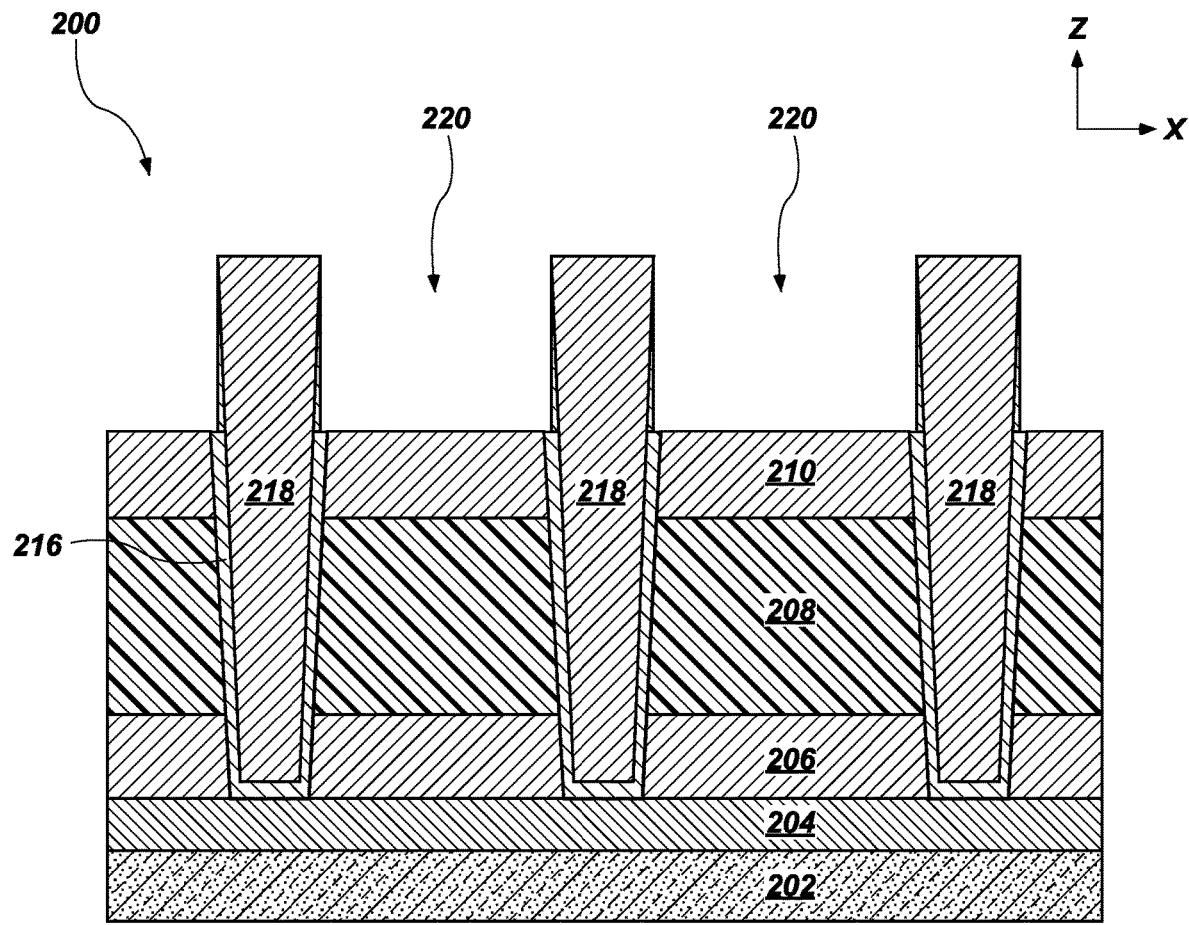

Referring next to FIG. 11E, the sacrificial material 212 (FIG. 11D) and portions of the channel structures 216 positioned vertically above upper boundaries of the second dielectric material 210 may be selectively removed (e.g., relative to the dielectric structures 218 and the second dielectric material 210) to form additional openings 220 defined by upper surfaces of the second dielectric material 210 and upper portions of sidewalls of the dielectric structures 218. The openings 220 may substantially laterally surround the upper portions of the dielectric structures 218. The openings 220 may be formed using conventional material removal processes (e.g., conventional wet etching processes, conventional dry etching processes), which are not described in detail herein.

Figure 11F:
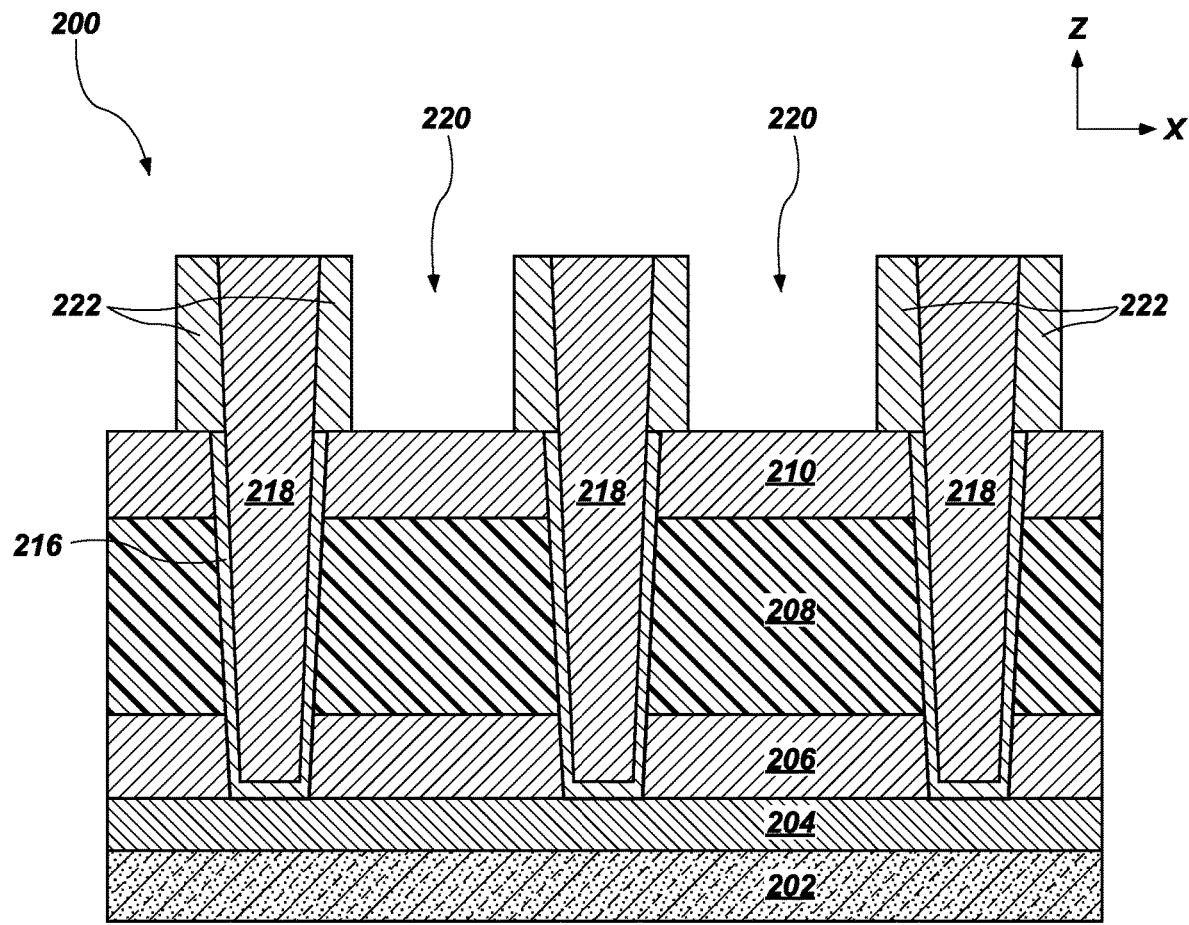

Referring next to FIG. 11F, capacitor contacts 222 may be formed on exposed upper surfaces of the channel structures 216 and the second dielectric material 210. The capacitor contacts 222 may be positioned laterally adjacent the exposed surfaces of the upper portions of the dielectric structures 218. Each of the capacitor contacts 222 may individually substantially laterally surround one of the dielectric structures 218. The capacitor contacts 222 may serve as source regions of subsequently formed transistors, as described in further detail below. The capacitor contacts 222 may be formed of and include at least one N-type conductivity material. By way of non-limiting example, the N-type conductivity material may comprise polysilicon doped with at least one N-type dopant (e.g., arsenic ions, phosphorous ions, antimony ions). A material composition of the capacitor contacts 222 may be substantially the same as or may be different than that of the digit line contacts 204.

The capacitor contacts 222 may be formed using conventional processes and conventional processing equipment, which are not described in detail herein. By way of non-limiting example, an N-type conductivity material may be conformally formed (e.g., deposited through one or more of a PVD process, a CVD process, an ALD process, and a spin-coating process) over exposed surfaces of the dielectric structures 218, the channel structures 216, and the second dielectric material 210, and then an anisotropic etching process may be performed to remove the N-type conductivity material from upper surfaces of the dielectric structures 218 and from portions of the upper surfaces of the second dielectric material 210, while maintaining the gate material on the upper surfaces of the channel structures 216 and on the sidewalls of the upper portions of the dielectric structures 218.

Figure 11G:
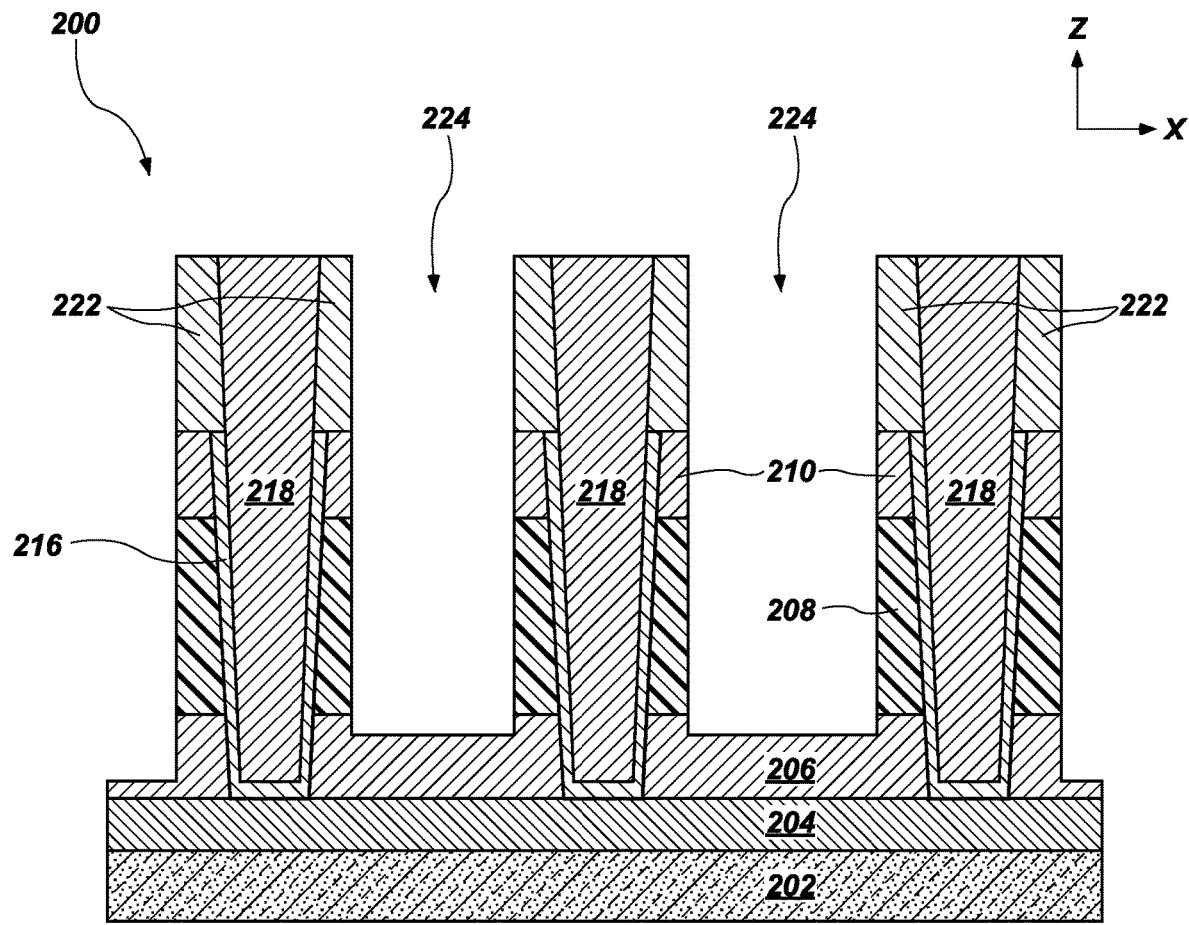

Referring next to FIG. 11G, portions of the second dielectric material 210, the sacrificial dielectric material 208, and the first dielectric material 206 not covered by the capacitor contacts 222 may be selectively removed to form linear trenches 224. As shown in FIG. 13, the linear trenches 224 may vertically extend from upper surfaces of the capacitor contacts 222 to one or more locations in the first dielectric material 206 above a lowermost boundary of the first dielectric material 206. The linear trenches 224 may laterally extending a direction substantially orthogonal to a direction (e.g., the X-direction) in which the digit lines 202. The linear trenches 224 may expose portions of the sacrificial dielectric material 208 for subsequent removal, as described in further detail below. During the material removal process the capacitor contacts 222 may protect portions of the second dielectric material 210, the sacrificial dielectric material 208, and the first dielectric material 206 covered thereby from removal.

The linear trenches 224 may be formed using conventional processes and conventional processing equipment, which are not described in detail herein. By way of non-limiting example, the second dielectric material 210, the sacrificial dielectric material 208, and the first dielectric material 206 may be exposed to at least one anisotropic etching process (e.g., at least one dry anisotropic etching process, such as at least one of a reactive ion etching (RIE) process, a deep RIE process, a plasma etching process, a reactive ion beam etching process, and a chemically assisted ion beam etching process) to form the linear trenches 224.

Figure 11H:
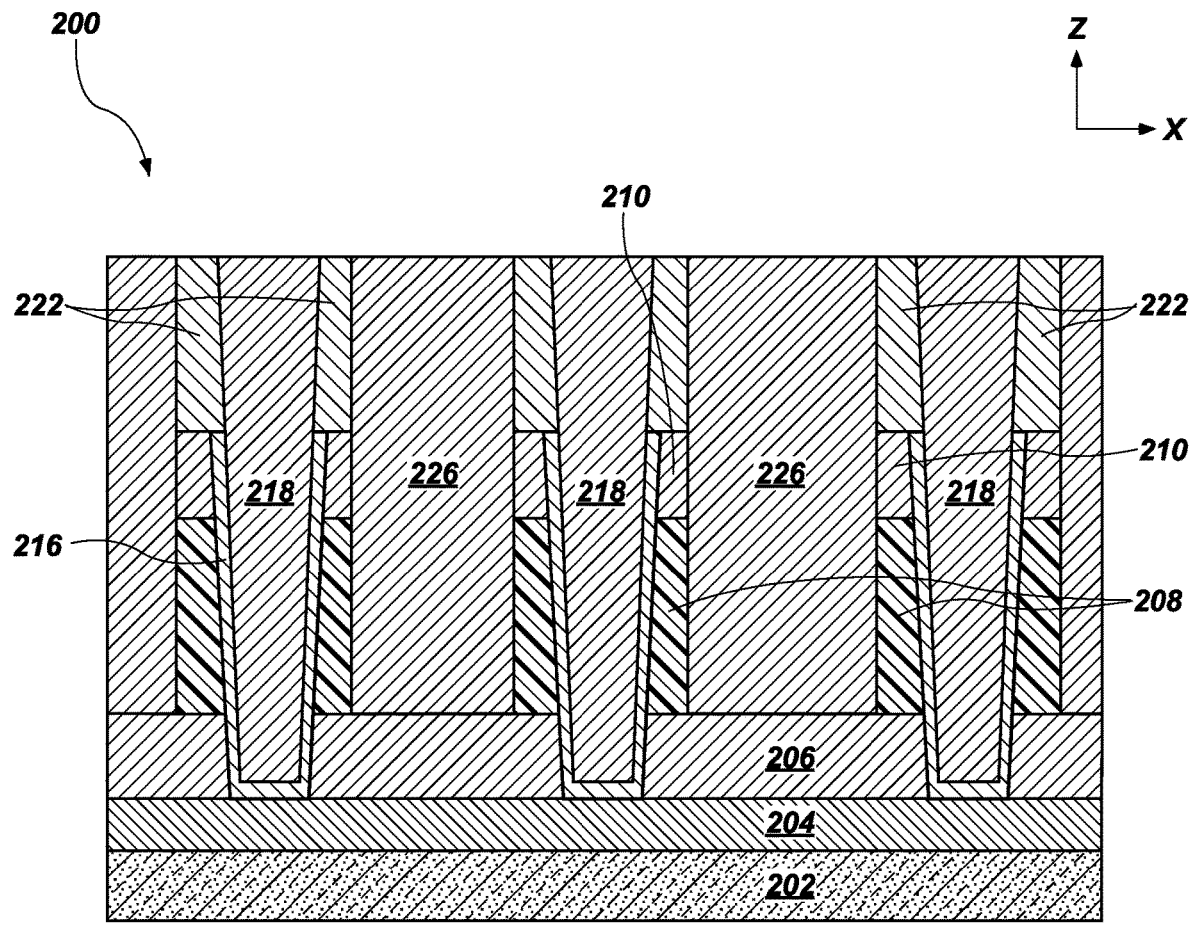

Next, referring to FIG. 11H, a third dielectric material 226 may be formed within the linear trenches 224 (FIG. 11G). The third dielectric material 226 may substantially fill the linear trenches 224 (FIG. 11G). The third dielectric material 226 may have etch selectivity relative to the sacrificial dielectric material 208. By way of non-limiting example, the third dielectric material 226 may comprise an oxide dielectric material, such as one or more of $SiO_2$, $Al_2O_3$, phosphosilicate glass, borosilicate glass, borophosphosilicate glass, and fluorosilicate glass. A material composition of the third dielectric material 226 may be substantially the same as or may be different than that of one or more (e.g., each) of the first dielectric material 206, the second dielectric material 210, and the dielectric structures 218. In some embodiments, the third dielectric material 226 is $SiO_2$.

The third dielectric material 226 may be formed using conventional processes and conventional processing equipment, which are not described in detail herein. By way of non-limiting example, a dielectric material (e.g., an oxide dielectric material) may be non-conformally formed (e.g., non-conformally deposited through a PVD process) on exposed surfaces of the first dielectric material 206, the sacrificial dielectric material 208, the second dielectric material 210, the capacitor contacts 222, and the dielectric structures 218, and then portions of the dielectric material outside of the boundaries (e.g., the vertical boundaries, the lateral boundaries) of the linear trenches 224 (FIG. 11G) may be removed (e.g., by way of an abrasive planarization process, such as a CMP process).

Figure 11I:
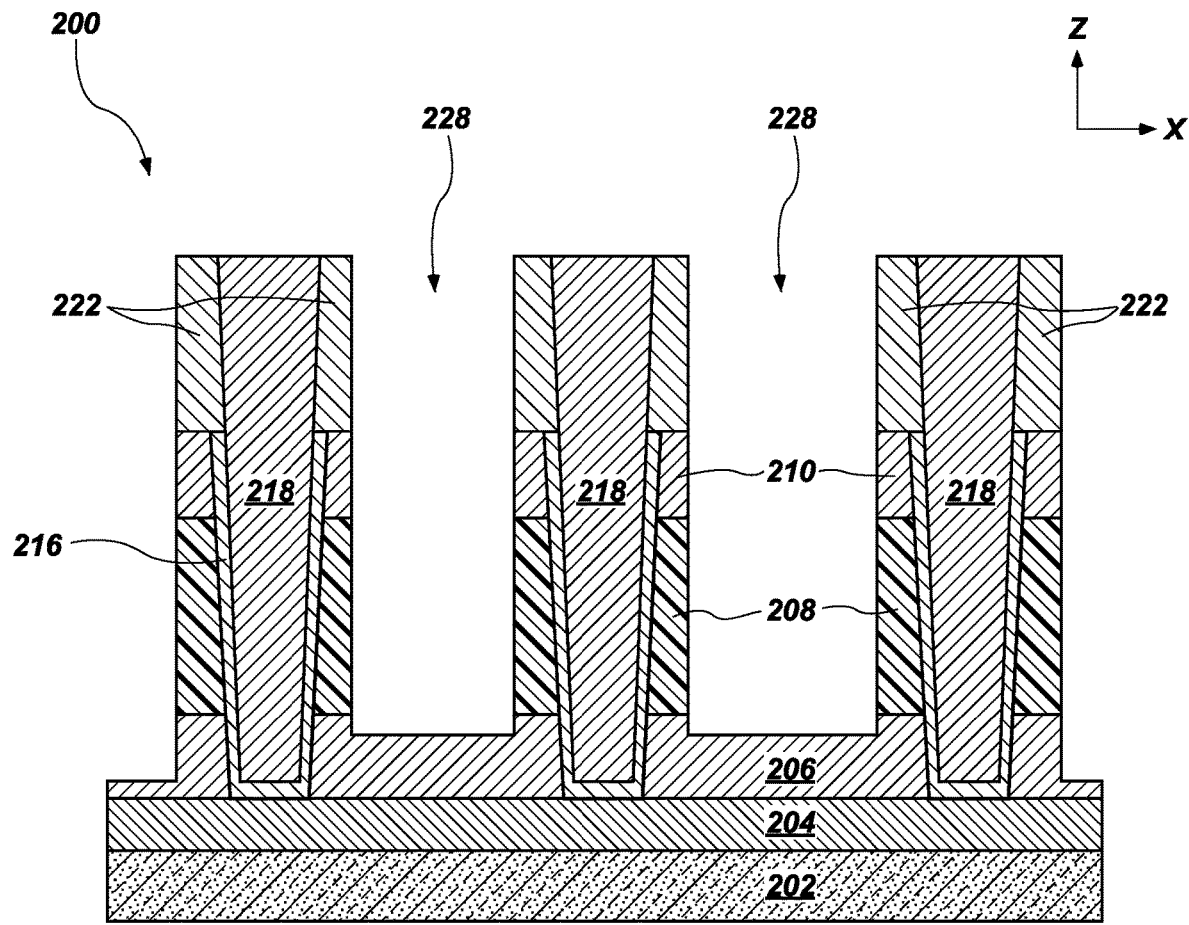

Referring next to FIG. 11I, portions of the third dielectric material 226 (FIG. 11H) may be removed to form apertures 228 (e.g., vias, open, holes) extending through remaining portions of the third dielectric material 226 (FIG. 11H) and exposing portions of the sacrificial dielectric material 208. As shown in FIG. 11I, the apertures 228 expose side surfaces of the sacrificial dielectric material 208. The apertures 228 exhibit geometric configurations (e.g., different sizes, different shapes) than the linear trenches 224 (FIG. 11G) within which the third dielectric material 226 (FIG. 11I) is formed. For example, the apertures 228 may each individually exhibit a generally columnar (e.g., circular columnar) shape. Accordingly, the apertures 228 may be partially laterally surrounded (e.g., in a direction orthogonal to the X-direction shown in FIG. 11I) by remaining portions of the third dielectric material 226 (FIG. 11H, omitted from FIG. 11I for clarity and ease of understanding of the drawings and related description with respect to the apertures 228). Put another way, some portions of the sidewalls of the sacrificial dielectric material 208 may be exposed by the apertures 228, while other portions of the sidewalls of the sacrificial dielectric material 208 may remain covered by remaining portions of the third dielectric material 226.

The apertures 228 may be formed in the third dielectric material 226 (FIG. 11I) using conventional processes, which are not described in detail herein. By way of non-limiting example, portions (e.g., less than all) of the third dielectric material 226 (FIG. 11I) may be subjected to anisotropic etching (e.g., anisotropic dry etching, such as one or more of RIE, deep RIE, plasma etching, reactive ion beam etching, and chemically assisted ion beam etching) to form the apertures 228.

Figure 11J:
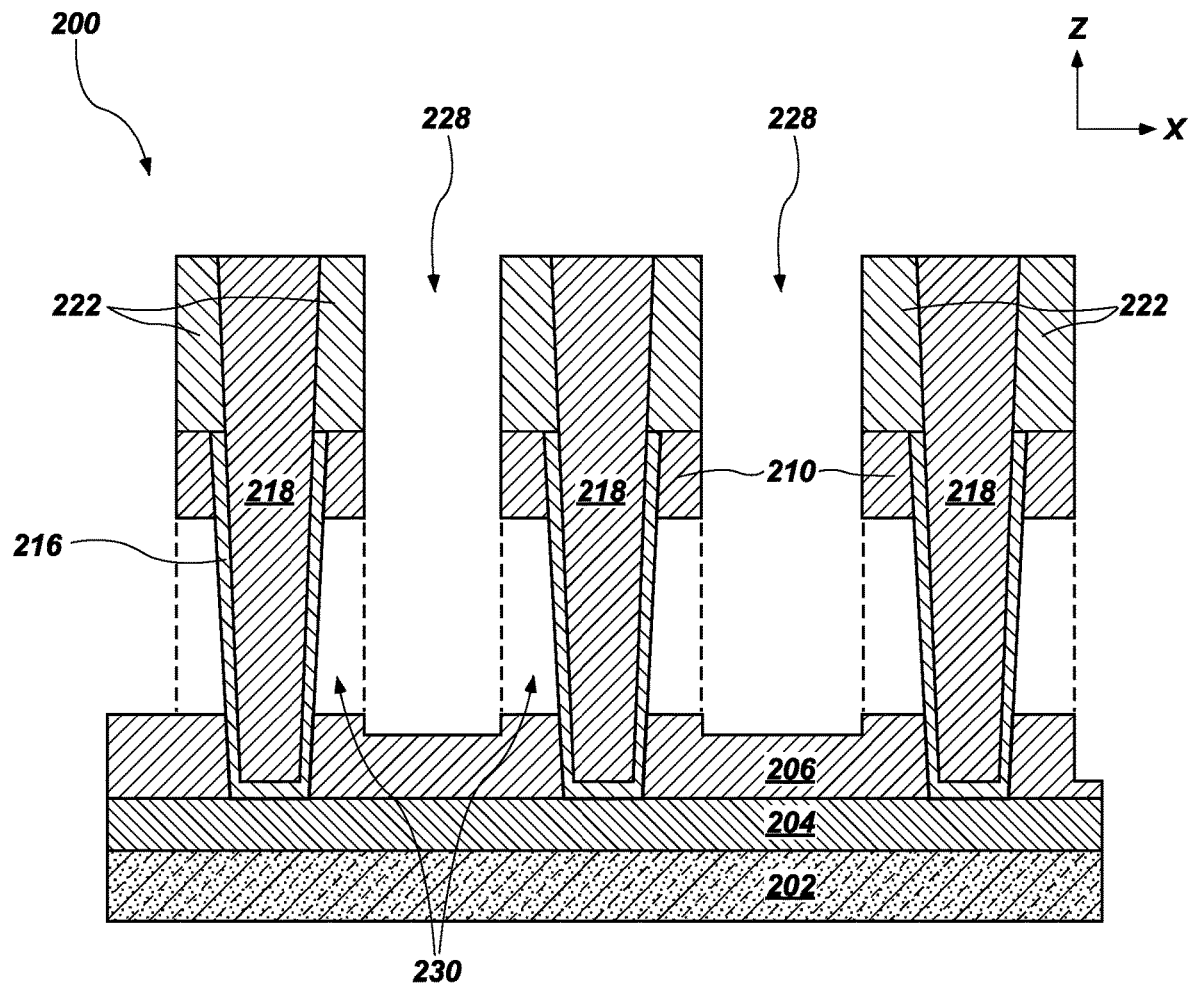

Referring next to FIG. 11J, the sacrificial dielectric material 208 (FIG. 11I) may be selectively removed to form tunnels 230 laterally adjacent the channel structures 216 and linearly extending a direction substantially orthogonal to a direction (e.g., the X-direction) in which the digit lines 202. The tunnels 230 are accessible by way of the apertures 228 (delineated, for clarity and ease of understanding of the drawings and related description, in FIG. 11J from the tunnels 230 by way of dashed lines). Portions of the tunnels 230 not directly adjacent the apertures 228 may be substantially surrounded and defined by surfaces of the channel structures 216, and surfaces of remaining portions of the first dielectric material 206, the second dielectric material 210, and the third dielectric material 226 (FIG. 11H, omitted from FIG. 11J for clarity and ease of understanding of the drawings and related description with respect to the apertures 228).

The sacrificial dielectric material 208 (FIG. 11I) may be selectively removed (e.g., exhumed) by way of the apertures 228 by treating the apparatus structure 200 with at least one etchant (e.g., wet etchant) formulated to selectively remove sacrificial dielectric material 208 (FIG. 11I) without substantially removing exposed portions of the channel structures 216, the capacitor contacts 222, the first dielectric material 206, the second dielectric material 210, the third dielectric material 226, and the dielectric structures 218. The apparatus structure 200 may be exposed to the etchant using conventional processes (e.g., spin-coating process, a spray-coating process, an immersion-coating process, a vapor-coating process, a soaking process, combinations thereof) and conventional processing equipment, which are not described in detail herein.

Figure 11K:
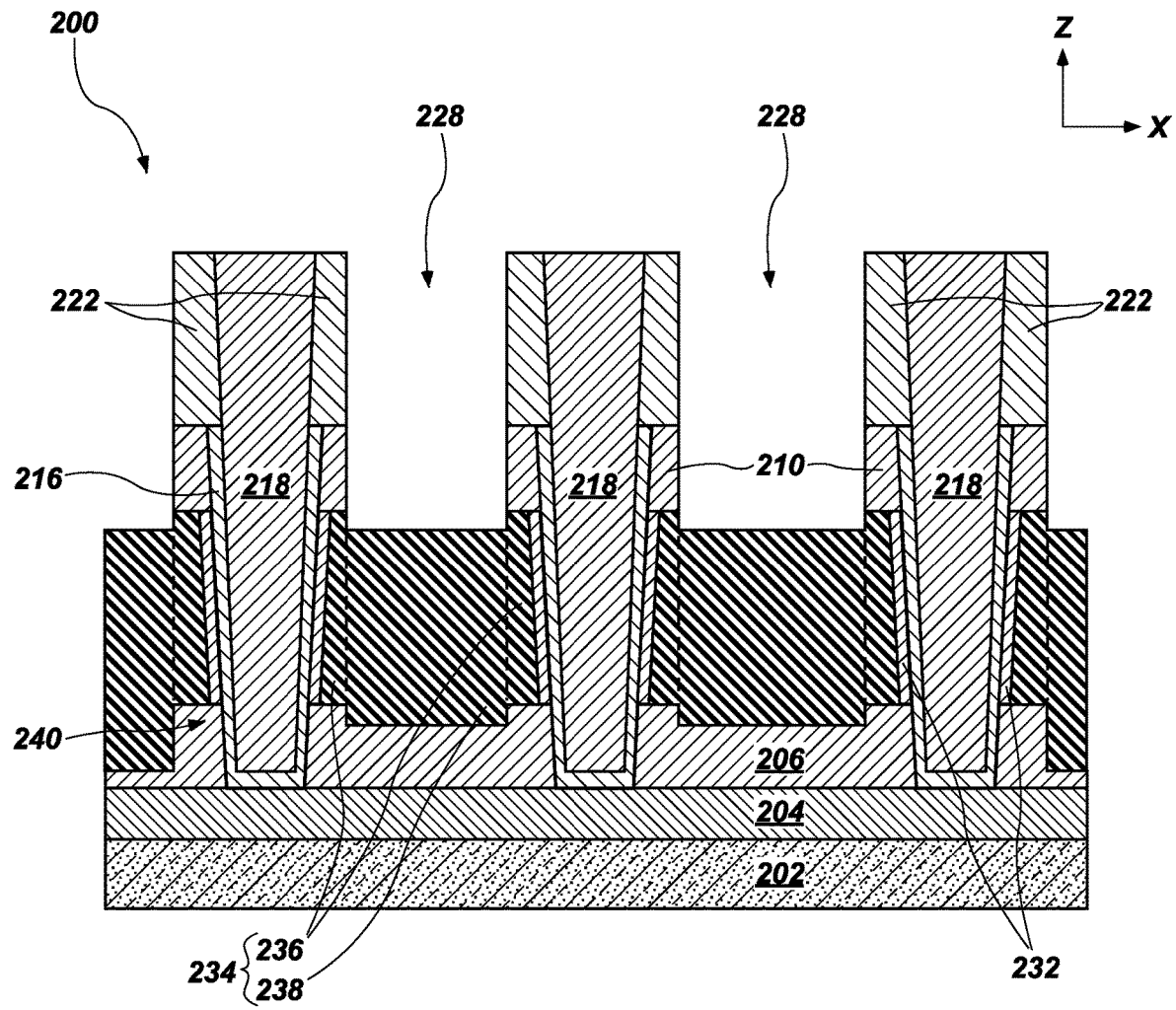

Referring next to FIG. 11K, a gate dielectric material 232 may be formed on exposed surfaces of the channel structures 216, and word lines 234 may be formed within the tunnels 230 (FIG. 11J) and the apertures 228 (FIG. 11J). The gate dielectric material 232 may laterally intervene between the word lines 234 and the channel structures 216.

The gate dielectric material 232 may substantially cover portions of the sidewalls of the channel structures 216 not covered by the first dielectric material 206, the second dielectric material 210, the third dielectric material 226 (FIG. 11H), and the dielectric structures 218. The gate dielectric material 232 may, for example, comprise an oxide dielectric material, such as one or more of $SiO_2$, $Al_2O_3$, hafnium oxide ($HfO_2$), a hafnium silicon oxide ($HfSiO_x$), an aluminum silicon oxide ($AlSiO_x$), a phosphosilicate glass, borosilicate glass, borophosphosilicate glass, and fluorosilicate glass. A material composition of the gate dielectric material 232 may be substantially the same as or may be different than that of one or more (e.g., each) of the first dielectric material 206, the second dielectric material 210, the third dielectric material 226 (FIG. 11H), and the dielectric structures 218. In some embodiments, the gate dielectric material 232 is $SiO_2$.

The gate dielectric material 232 may be formed using conventional processes and conventional processing equipment, which are not described in detail herein. By way of non-limiting example, the gate dielectric material 232 may be grown (e.g., epitaxially grown) on the channel structures 216 through a thermal oxidation process. The thermal oxidation process may include exposing the channel structures 216 to at least one oxidizing agent at a temperature within a range of from about 800° C. to about 1200° C.

The word lines 234 may substantially (e.g., completely) fill portions of the tunnels 230 (FIG. 11J) not occupied by the gate dielectric material 232, and may also partially (e.g., less than completely) fill the apertures 228. As shown in FIG. 11K, the word lines 234 may include elevated portions 236 and recessed portions 238. The elevated portions 236 may be located (e.g., confined) within the tunnels 230 (FIG. 11J) may be laterally extend in a direction substantially orthogonal to a direction (e.g., the X-direction) in which the digit lines 202 laterally extend. The recessed portions 238 may located (e.g., confined) within the apertures 228, laterally extend (e.g., in the X-direction) from and between the elevated portions 236. In FIG. 11K the elevated portions 236 of the word lines 234 are delineated, for clarity and ease of understanding of the drawings and related description, from the recessed portions 238 of the word lines 234 by way of dashed lines. However, the elevated portions 236 and the recessed portions 238 of the word lines 234 are formed to be integral and continuous with another.

The word lines 234 may be formed of and include at least one electrically conductive material, such as one or more of a metal, an alloy, a conductive metal oxide, a conductive metal nitride, a conductive metal silicide, and a conductively doped semiconductor material. By way of non-limiting example, the word lines 234 may be formed of and include one or more of W, WN, Ni, Ta, TaN, TaSi, Pt, Cu, Ag, Au, Al, Mo, Ti, TiN, TiSi, TiSiN, TiAlN, MoN, Ir, $IrO_x$, Ru, $RuO_x$, and conductively doped silicon. A material composition of the word lines 234 may be substantially the same as or may be different than that of the digit lines 202. In some embodiments, the word lines 234 are formed of and include TiN.

The word lines 234 may be formed using conventional processes (e.g., conventional material deposition processes, conventional material removal processes) and conventional processing equipment, which are not described in detail herein. By way of non-limiting example, an electrically conductive material may be deposited within the tunnels 230 (FIG. 11J) and the apertures 228 using one or more of a PVD process, a CVD process, and an ALD process.

As shown in FIG. 11K, the digit line contacts 204, the channel structures 216, the capacitor contacts 222, the gate dielectric material 232, and the word lines 234 may form transistors 240 of the apparatus structure 200. The transistors 240 may correspond to the first transistors 120A (FIG. 3) or the second transistors 120B (FIG. 3) of the memory cells 120 (FIG. 3) of one of memory decks 102 (FIG. 3) of the apparatus 100 previously described with reference to FIGS. 1 through 3. The apparatus structure 200 may be subjected to additional processing to form the addition components (e.g., the other of the first transistors 120A and the second transistors 120B; the capacitors 120C) of the memory cells 120 (FIG. 3), as described in further detail below.

Figure 11L:
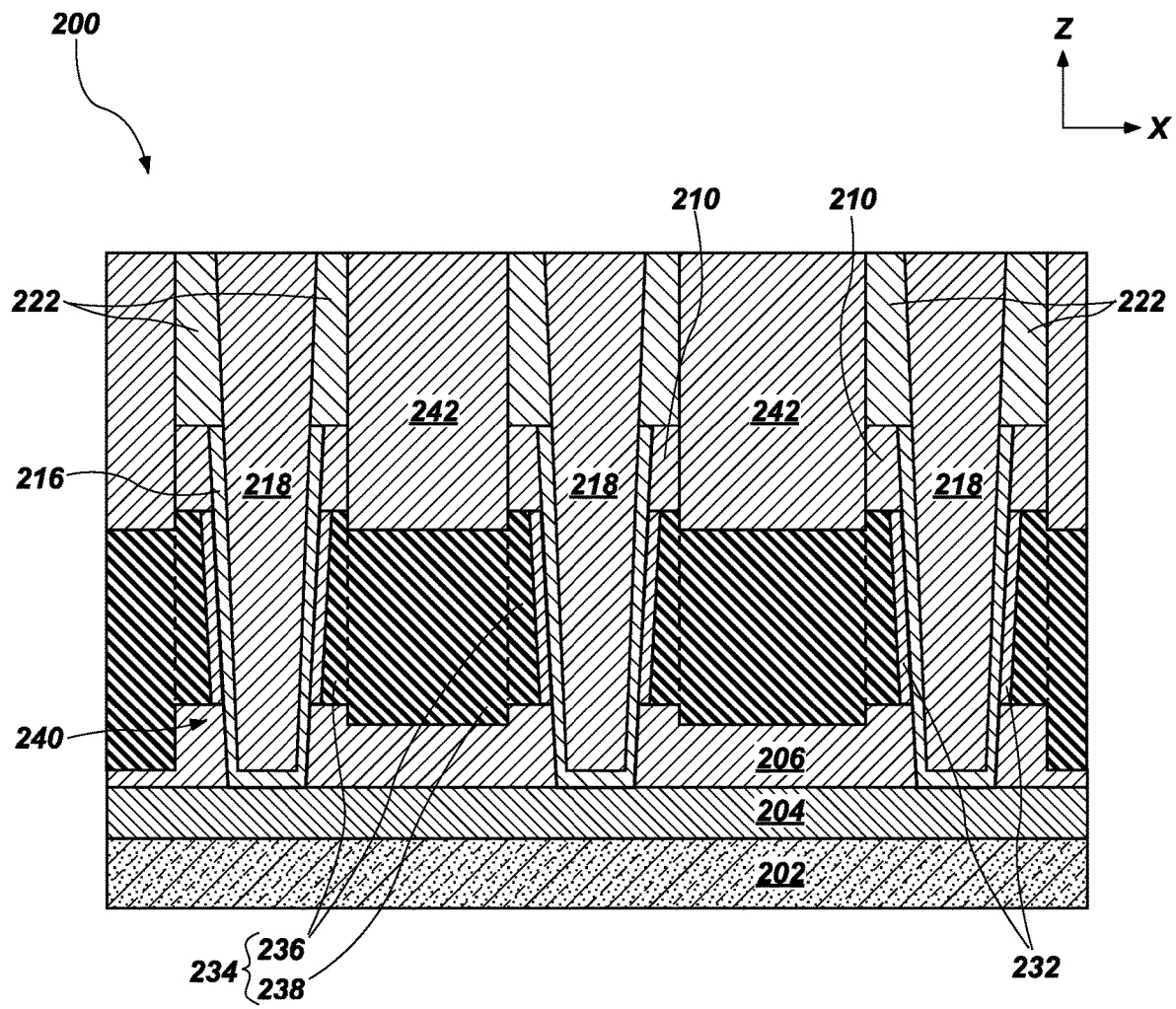

Referring next to FIG. 11L, a fourth dielectric material 242 may be formed within remaining (e.g., unfilled) portions of the apertures 228 (FIG. 11K). The fourth dielectric material 242 may substantially fill the remaining portions of the apertures 228 (FIG. 11K). The fourth dielectric material 242 may, for example, comprise an oxide dielectric material, such as one or more of $SiO_2$, $Al_2O_3$, $HfO_2$, $HfSiO_x$, $AlSiO_x$, a phosphosilicate glass, borosilicate glass, borophosphosilicate glass, and fluorosilicate glass. A material composition of the fourth dielectric material 242 may be substantially the same as or may be different than that of one or more (e.g., each) of the first dielectric material 206, the second dielectric material 210, the third dielectric material 226, and the dielectric structures 218. In some embodiments, the fourth dielectric material 242 is $SiO_2$.

The fourth dielectric material 242 may be formed using conventional processes and conventional processing equipment, which are not described in detail herein. By way of non-limiting example, a dielectric material (e.g., an oxide dielectric material) may be non-conformally formed (e.g., non-conformally deposited through a PVD process) on exposed surfaces of the word lines 234, the second dielectric material 210, the capacitor contacts 222, and the dielectric structures 218, and then portions of the dielectric material outside of the boundaries (e.g., the vertical boundaries, the lateral boundaries) of the apertures 228 (FIG. 11K) may be removed (e.g., by way of an abrasive planarization process, such as a CMP process).

Figure 11M:
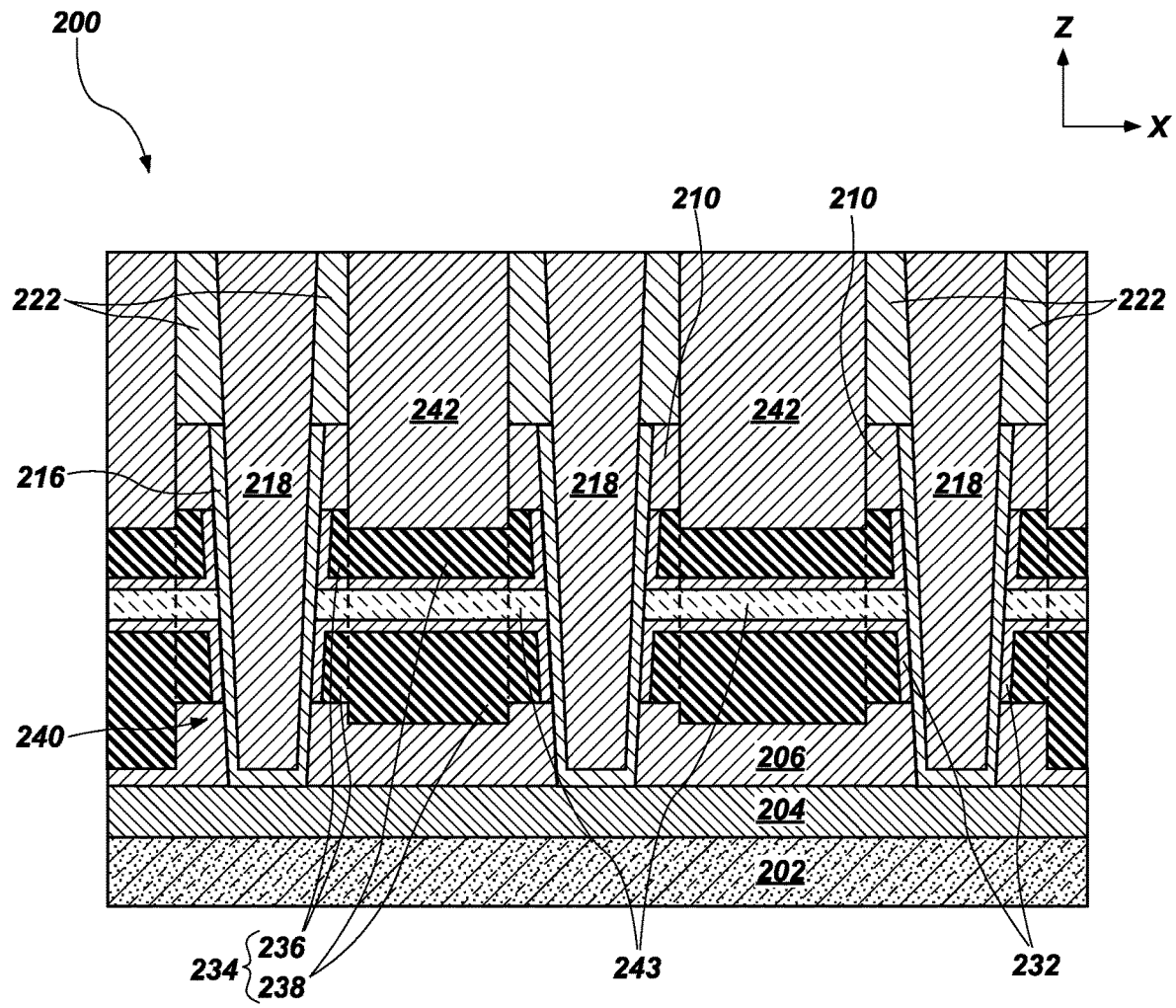

Referring to FIG. 11M, in accordance with some embodiments of the disclosure, the apparatus structure 200 may, optionally, be formed to include p-well contacts 243 laterally extending from and between channel structures 216 of laterally-neighboring transistors 240. The p-well contacts 243 may be formed of and include at least one P-type conductivity material. By way of non-limiting example, the P-type conductivity material may comprise polysilicon doped with at least one P-type dopant (e.g., boron ions). The p-well contacts 243 may be formed by forming (e.g., through convention material removal and material deposition processes) a pattern (e.g., an X-shaped pattern) of intersecting P-type conductivity spacers within the sacrificial dielectric material 208 (FIG. 11A) and then proceeding with the method steps previously described with reference to FIGS. 11B through 11L. Portions of the P-type conductivity material remaining within the remaining portions of the sacrificial dielectric material 208 (FIG. 11B) following the formation of the openings 214 (FIG. 11B) form the p-well contacts 243, which remain following the selective removal portions of the sacrificial dielectric material 208, the second dielectric material 210, third dielectric material 226 through the method steps previously described with reference to FIGS. 11G-11J, and become vertically surrounded by the gate dielectric material 232 and the word lines 234 through the method step previously described with reference to FIG. 11k.

With returned reference to FIG. 11L, following the formation of the fourth dielectric material 242, the apparatus structure 200 may be subjected to additional processing to form an array of memory cells including the transistors 240. For example, referring to FIG. 11N, capacitors 244 may be formed vertically over and in electrical communication with the capacitor contacts 222 of the transistors 240, and then additional transistors 240' may be formed vertically over and in electrical communication with the capacitors 244. The capacitors 244 may be laterally separated from one another by a fifth dielectric material 246 (e.g., an oxide dielectric material) having a material composition substantially similar to or different than that of one or more of the first dielectric material 206, the second dielectric material 210, the third dielectric material 226, the fourth dielectric material 242, and the dielectric structures 218. The transistors 240, the capacitors 244, and the additional transistors 240' may form memory cells 248 corresponding to the memory cells 120 previously described herein with reference to FIG. 3. The transistors 240 may correspond to (e.g., be employed as) the first transistors 120A (FIG. 3), the capacitors 244 may correspond to the capacitors 120C, and the additional transistors 240' may correspond to the second transistors 120B. The apparatus structure 200 may, for example, correspond to one of the memory decks 102 of one of the 3D memory arrays 103 of the memory structure 101 of the apparatus 100 previously described with reference to FIGS. 1 through 3.

Figure 11N:
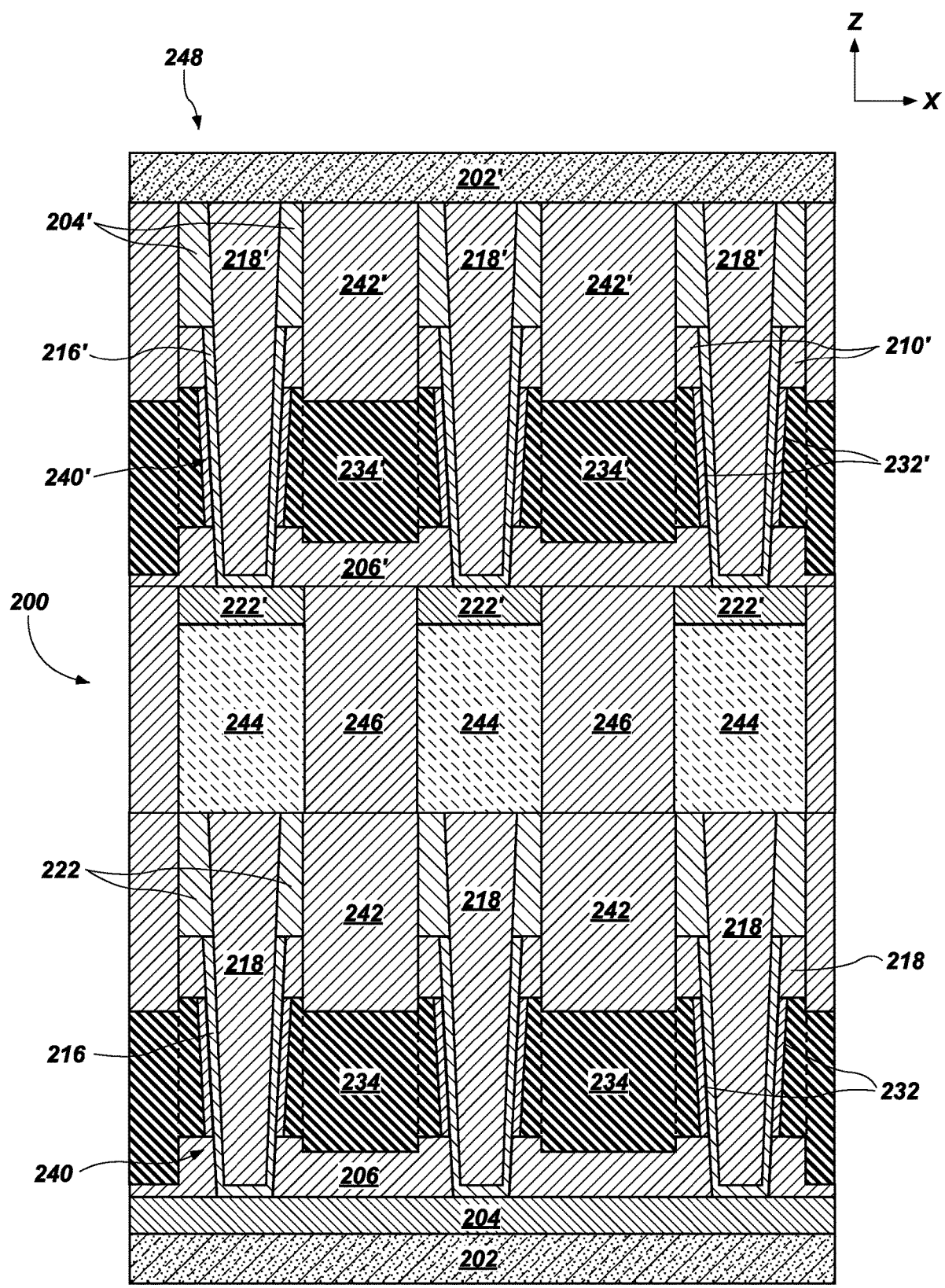

To avoid repetition, not all features shown in FIG. 11N are described in detail herein. In FIG. 11N, unless otherwise described, a feature designated by a reference numeral that as a prime (') of a reference numeral of a previously-described feature will be understood to be substantially similar to the previously-described feature and will also be understood to be formed in substantially the same manner as the previously-described feature. For example, an additional first dielectric material 206', an additional second dielectric material 210', an additional fourth dielectric material 242', additional dielectric structures 218', additional channel structures 216', and additional word lines 234' may respectively be substantially similar to and may formed in substantially the same manner as the first dielectric material 206, the second dielectric material 210, the fourth dielectric material 242, the dielectric structures 218, the channel structures 216, and the word lines 234 previously described with reference to FIGS. 12A through 12L. As shown in FIG. 11N, additional capacitor contacts 222' of the additional transistors 240' may exhibit different geometric configurations than the capacitor contacts 222 of the transistors 240 as a result of the different arrangement of the additional transistors 240' relative to the capacitors 244, as may additional digit line contacts 204' (e.g., geometric configuration more similar to the capacitor contacts 222) of the additional transistors 240'. The additional capacitor contacts 222' of the additional transistors 240' may be formed through conventional processes, and may serve substantially the same function as the capacitor contacts 222 of the transistors 240. Furthermore, the additional digit line contacts 204' of the additional transistors 240' may be formed in substantially the same manner as the capacitor contacts 222 of the transistors 240, and may serve substantially the same function as the digit line contacts 204 of the transistors 240. Additional digit lines 202' may be substantially similar to the digit lines 202, and may be formed over the additional digit line contacts 204' through processes substantially similar to those employed to form the digit lines 202.

Thus, in accordance with embodiments of the disclosure, a method of forming an apparatus comprises forming a stack structure comprising digit lines, digit line contacts over the digit lines, a first dielectric material over the digit line contacts, a sacrificial dielectric material over the first dielectric material, a second dielectric material over the sacrificial dielectric material, and a sacrificial material over the second dielectric material. Channel structures are formed to vertically extend from an upper surface of the sacrificial material to upper surfaces of the digit line contacts, each of the channel structures comprising a generally tubular sidewall integral and continuous with a floor. Portions of the sacrificial material and the channel structures above upper boundaries of the second dielectric material are removed. Capacitor contacts are formed on exposed upper surfaces of the channel structures and the second dielectric material. Linear trenches are formed between the capacitor contacts, the linear trenches vertically extending from upper surfaces of the capacitors contacts to the first dielectric material and laterally extending substantially orthogonal to a direction of the digit lines. The linear trenches are formed with a third dielectric material. Portions of the third dielectric material are removed to form apertures exposing portions of the sacrificial dielectric material. Portions of the sacrificial dielectric material are removed to form tunnels laterally extending substantially orthogonal to the direction of the digit lines. Word lines are formed within the tunnels and lower portions of the apertures.

Figure 12:
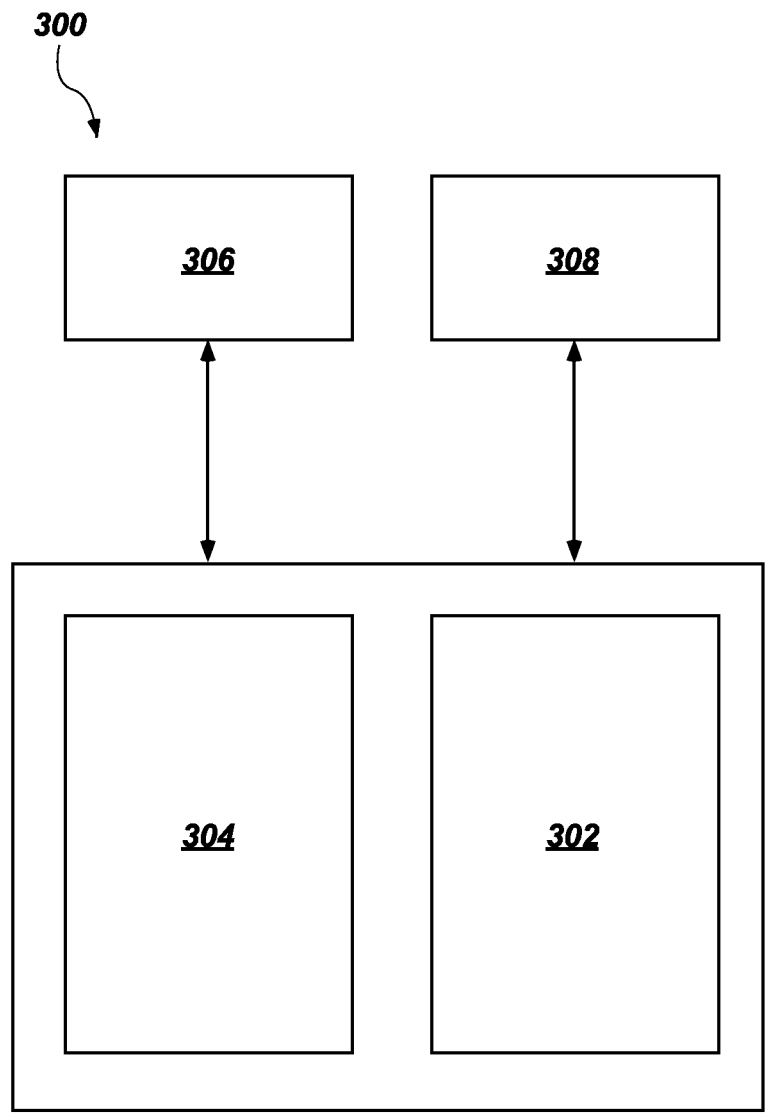
FIG. 12 is a block diagram of an illustrative electronic system according to embodiments of the disclosure.

Apparatus structures (e.g., the apparatus structure 200) and apparatuses (e.g., the apparatus 100) in accordance with embodiments of the disclosure may be used in embodiments of electronic systems of the disclosure. For example, FIG. 12 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302 (e.g., at least one DRAM device). The memory device 302 may comprise, for example, an embodiment of one or more of an apparatus structure (e.g., the apparatus structure 200) and an apparatus (e.g., the apparatus 100) previously described herein. The electronic system 300 may further include at least one electronic signal processor device 304 (often referred to as a "microprocessor"). The electronic signal processor device 304 may, optionally, include an embodiment of an apparatus structure (e.g., the apparatus structure 200) and an apparatus (e.g., the apparatus 100) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, an electronic system according to embodiments of the disclosure comprises an input device, an output device, a processor device operably coupled to the input device and the output device, and a memory device operably coupled to the processor device. The memory device comprises a base structure, a memory structure, odd digit line interconnect structures, even digit line interconnect structures, odd word line interconnect structures, and even word line interconnect structures. The base structure comprises odd sense amplifier regions, even sense amplifier regions, odd word line driver regions, and even word line driver regions. The memory structure overlies the base structure and comprises memory decks. The memory decks each comprise digit lines, additional digit lines, memory cells, and word lines. The digit lines comprise odd digit lines and even digit lines laterally alternating with the odd digit lines. The additional digit lines comprise additional odd digit lines and additional even digit lines laterally alternating with the additional odd digit lines. The memory cells are vertically between and electrically connected to the digit lines and the additional digit lines. Each memory cell comprises a lower transistor, an upper transistor, and a capacitor vertically between the lower transistor and the upper transistor. The word lines are electrically electrical connected to the memory cells and laterally extend orthogonal to the digit lines. The word lines comprise odd word lines and even word lines laterally alternating with the odd word lines. The odd digit line interconnect structures electrically connect the odd sense amplifier regions of the base structure to the odd digit lines and the additional odd digit lines of the memory structure. The even digit line interconnect structures electrically connect the even sense amplifier regions of the base structure to the even digit lines and the additional even digit lines of the memory structure. The odd word line interconnect structures electrically connect the odd word line driver regions of the base structure to the odd word lines of the memory structure. The even word line interconnect structures electrically connect the even word line driver regions of the base structure to the even word lines of the memory structure.

The devices, structures, and methods of the disclosure advantageously facilitate improved apparatus (e.g., semiconductor device; memory device, such as DRAM device) performance, reduced costs (e.g., manufacturing costs, material costs), increased miniaturization of components, and greater packaging density as compared to conventional devices, conventional structures, and conventional methods. The devices, structures, and methods of the disclosure may also improve performance, scalability, efficiency, and simplicity as compared to conventional devices, conventional structures, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. An apparatus, comprising:
   a base structure comprising odd sense amplifiers and even sense amplifiers;
   a memory structure vertically overlying the base structure and comprising 3D memory arrays having decks each individually comprising:
      digit lines extending in a first lateral direction and comprising odd digit lines and even digit lines laterally alternating with the odd digit lines;
      additional digit lines extending in the first lateral direction and comprising additional odd digit lines and additional even digit lines laterally alternating with the additional odd digit lines;
      memory cells vertically extending between and electrically connected to the digit lines and the additional digit lines, each of the memory cells comprising a first transistor, a second transistor, and a capacitor vertically between the first transistor and the second transistor; and
      word lines electrically connected to the memory cells and extending in a second lateral direction orthogonal to the first lateral direction, the word lines comprising odd word lines and even word lines laterally alternating with the odd word lines; and
   digit line interconnect structures comprising:
      odd digit line interconnect structures vertically extending between and electrically connecting the odd sense amplifiers to the odd digit lines and the additional odd digit lines; and
      even digit line interconnect structures vertically extending between and electrically connecting the odd sense amplifiers to the odd digit lines and the additional odd digit lines.

2. The apparatus of claim 1, wherein the decks of the 3D memory arrays each exhibit a hexagonal pattern of the memory cells thereof.

3. The apparatus of claim 1, wherein:
   the odd sense amplifiers are connected to odd base digit lines and additional odd base digit lines within the base structure;
   a group of the odd digit line interconnect structures are connected to the odd base digit lines, and another group of the odd digit line interconnect structures are connected to the additional odd base digit lines;
   the even sense amplifiers are connected to even base digit lines and additional even base digit lines within the base structure; and
   a group of the even digit line interconnect structures are connected to the even base digit lines, and another group of the even digit line interconnect structures are connected to the additional even base digit lines.

4. The apparatus of claim 1, wherein, for each of the 3D memory arrays, the decks comprise:
   a first deck comprising a first group of the memory cells vertically extending between a first group of the digit lines and a first group of the additional digit lines;
   a second deck vertically overlying the first deck and comprising a second group of the memory cells vertically extending between the first group of the additional digit lines and a second group of the digit lines; and
   a third deck vertically overlying the second deck and comprising a third group of the memory cells vertically extending between the second group of the digit lines and a second group of the additional digit lines.

5. The apparatus of claim 4, wherein:
   the first group of the digit lines are connected to a first group of the digit line interconnect structures;
   the first group of the additional digit lines are connected to a second group of the digit line interconnect structures;
   the second group of the digit lines are connected to a third group of the digit line interconnect structures;
   the second group of the additional digit lines are connected to a fourth group of the digit line interconnect structures; and
   the first group of the digit line interconnect structures, second group of the digit line interconnect structures, third group of the digit line interconnect structures, and the fourth group of the digit line interconnect structures are laterally offset from one another.

6. The apparatus of claim 5, wherein:
   portions of the first group of the digit lines connected to the first group of the memory cells are substantially laterally aligned with portions of the first group of the additional digit lines connected to the first group of the memory cells;
   portions of the second group of the digit lines connected to the second group of the memory cells are substantially laterally aligned with portions of the first group of the additional digit lines connected to the second group of the memory cells; and portions of the second group of the additional digit lines connected to the third group of the memory cells are substantially laterally aligned with portions of the second group of the digit lines connected to the third group of the memory cells.

7. The apparatus of claim 6, wherein:
other portions of the first group of the digit lines connected to the first group of the digit line interconnect structures are laterally offset from other portions of the first group of the additional digit lines connected to the second group of the digit line interconnect structures;
other portions of the second group of the digit lines connected to the third group of the digit line interconnect structures are laterally offset from other portions of the first group of the additional digit lines connected to the second group of the digit line interconnect structures; and
other portions of the second group of the additional digit lines connected to the fourth group of the digit line interconnect structures are laterally offset from other portions of the second group of the digit lines connected to the third group of the digit line interconnect structures.

8. The apparatus of claim 7, wherein:
the other portions of the second group of the digit lines wind around the first group of the digit line interconnect structures and the second group of the digit line interconnect structures to connect to the third group of the digit line interconnect structures; and
the other portions of the second group of the additional digit lines wind around the first group of the digit line interconnect structures, the second group of the digit line interconnect structures, and the third group of the digit line interconnect structures to connect to a fourth group of the digit line interconnect structures.

9. The apparatus of claim 1, wherein the base structure further comprises:
odd word line drivers electrically connected to the odd word lines of the decks of the 3D memory arrays; and
even word line drivers electrically connected to the odd word lines of the decks of the 3D memory arrays.

10. The apparatus of claim 9, wherein:
the odd word lines of each of the decks of each of the 3D memory arrays comprise:
first odd word lines connected to the first transistors of a first group of the memory cells; and
second odd word lines vertically offset from and laterally aligned with the first odd word lines, the second odd word lines connected to the second transistors of the first group of the memory cells; and
the even word lines of each of the decks of each of the 3D memory comprise:
first even word lines connected to the first transistors of a second group of the memory cells; and
second even word lines vertically offset from and laterally aligned with the first even word lines, the second even word lines connected to the second transistors of the second group of the memory cells.

11. The apparatus of claim 10, wherein
the first odd word lines are shorted to the second odd word lines by first conductive connection structures; and
the first even word lines are shorted to the second even word lines by second conductive connection structures.

12. The apparatus of claim 11, further comprising:
odd word line interconnect structures electrically connected to the odd word line drivers;
even word line interconnect structures electrically connected to the even word line drivers;
first conductive line structures laterally extending from the first conductive connection structures to the odd word line interconnect structures, wherein each of the first conductive connection structures and each of the odd word line interconnect structures individually have only one of the first conductive line structures connected thereto; and
second conductive line structures laterally extending from the second conductive connection structures to the even word line interconnect structures, wherein each of the second conductive connection structures and each of the even word line interconnect structures individually have only one of the second conductive line structures connected thereto.

13. The apparatus of claim 12, wherein:
the first conductive line structures within a second of the decks of one of the 3D memory arrays vertically overlie and are substantially laterally aligned with the first conductive line structures within a first of the decks of the one of the 3D memory arrays; and
the second conductive line structures within the second of the decks of the one of the 3D memory arrays vertically overlie and are substantially laterally aligned with the second conductive line structures within the first of the decks of the one of the 3D memory arrays.

14. The apparatus of claim 13, further comprising:
additional interconnect structures positioned laterally between laterally-neighboring vertical stacks of the first conductive line structures; and
further interconnect structures positioned laterally between laterally-neighboring vertical stacks of the second conductive line structures.

15. The apparatus of claim 9, wherein the base structure exhibits a quilted layout comprising:
first linear openings laterally extending to parallel to one another and in substantially the same direction as the word lines of the 3D memory arrays;
second linear openings laterally extending parallel to one another and substantially orthogonal to the first linear openings; and
tiles between pairs of the first linear openings and pairs of the second linear openings, each of the tiles comprising:
a region of the odd sense amplifiers;
a region of the even sense amplifiers;
a region of the odd word line drivers positioned laterally between the region of the odd sense amplifiers and the region of the even sense amplifiers; and
a region of the even word line drivers positioned laterally between the region of the odd sense amplifiers and the region of the even sense amplifiers.

16. The apparatus of claim 15, wherein the tiles are laterally offset from one another and each individually exhibit one of the first linear openings laterally extending therethrough between the region of the odd sense amplifiers and the region of the even sense amplifiers.

17. The apparatus of claim 15, wherein the tiles are laterally offset from one another and are each free of one of the first linear openings laterally extending therethrough between the region of the odd sense amplifiers and the region of the even sense amplifiers.

18. A method of forming an apparatus, comprising:
forming a stack structure comprising digit lines, digit line contacts over the digit lines, a first dielectric material over the digit line contacts, a sacrificial dielectric material over the first dielectric material, a second dielectric material over the sacrificial dielectric material, and a sacrificial material over the second dielectric material;
forming channel structures vertically extending from an upper surface of the sacrificial material to upper surfaces of the digit line contacts, each of the channel structures comprising a generally tubular sidewall integral and continuous with a floor;
removing portions of the sacrificial material and the channel structures above upper boundaries of the second dielectric material;
forming capacitor contacts on exposed upper surfaces of the channel structures and the second dielectric material;
forming linear trenches between the capacitor contacts, the linear trenches vertically extending from upper surfaces of the capacitors contacts to the first dielectric material and laterally extending substantially orthogonal to a direction of the digit lines;
filling the linear trenches with a third dielectric material;
removing portions of the third dielectric material to form apertures exposing portions of the sacrificial dielectric material;
selectively removing the sacrificial dielectric material to form tunnels laterally extending substantially orthogonal to the direction of the digit lines; and
forming word lines within the tunnels and lower portions of the apertures.

19. The method of claim 18, wherein forming channel structures comprises:
forming openings vertically extending from the upper surface of the sacrificial material to the upper surfaces of the digit line contacts;
conformally forming a semiconductive material on exposed surfaces of the sacrificial material, the second dielectric material, the sacrificial dielectric material, the first dielectric material, and the digit line contacts inside and outside of the openings; and
removing portions of the semiconductive material outside boundaries of the openings.

20. The method of claim 19, further comprising forming dielectric structures within remaining portions of the openings after forming the channel structures.

21. The method of claim 18, wherein removing portions of the third dielectric material to form apertures comprises forming each of the apertures to exhibit a generally circular cross-sectional shape.

22. The method of claim 18, further comprising forming a gate dielectric material on exposed surfaces of the channel structures within the tunnels prior to forming the word lines.

23. The method of claim 18, further comprising filling upper, remaining portions of the apertures with a fourth dielectric material after forming the word lines.

24. The method of claim 18, further comprising forming p-well contacts laterally extending from and between at least some of the channel structures laterally-neighboring one another.

25. The method of claim 18, further comprising:
forming capacitors vertically over and in electrical communication with the capacitor contacts;
forming additional capacitor contacts vertically over and in electrical communication with the capacitors;
forming additional channel structures vertically over and in electrical communication with the additional capacitor contacts;
forming additional word lines in electrical communication with the additional channel structures;
forming additional digit line contacts vertically over and in electrical communication with the additional channel structures; and
forming additional digit lines vertically over and in electrical communication with the additional digit line contacts.

26. An electronic system, comprising:
an input device;
an output device;
a processor device operably coupled to the input device and the output device; and
a memory device operably coupled to the processor device and comprising:
a base structure comprising odd sense amplifier regions, even sense amplifier regions, odd word line driver regions, and even word line driver regions;
a memory structure overlying the base structure and comprising memory decks each comprising:
digit lines comprising odd digit lines and even digit lines laterally alternating with the odd digit lines;
additional digit lines comprising additional odd digit lines and additional even digit lines laterally alternating with the additional odd digit lines;
memory cells vertically between and electrically connected to the digit lines and the additional digit lines, each memory cell comprising a lower transistor, an upper transistor, and a capacitor vertically between the lower transistor and the upper transistor; and
word lines electrically electrical connected to the memory cells and laterally extending orthogonal to the digit lines, the word lines comprising odd word lines and even word lines laterally alternating with the odd word lines;
odd digit line interconnect structures electrically connecting the odd sense amplifier regions of the base structure to the odd digit lines and the additional odd digit lines of the memory structure;
even digit line interconnect structures electrically connecting the even sense amplifier regions of the base structure to the even digit lines and the additional even digit lines of the memory structure;
odd word line interconnect structures electrically connecting the odd word line driver regions of the base structure to the odd word lines of the memory structure; and
even word line interconnect structures electrically connecting the even word line driver regions of the base structure to the even word lines of the memory structure.

* * * * *

UNITED STATES PATENT AND TRADEMARK OFFICE
CERTIFICATE OF CORRECTION

PATENT NO. : 10,790,286 B2  
APPLICATION NO. : 16/212418  
DATED : September 29, 2020  
INVENTOR(S) : Werner Juengling Page 1 of 1

It is certified that error appears in the above-identified patent and that said Letters Patent is hereby corrected as shown below:

In the Specification

| | | |
|---|---|---|
| Column 1, | Line 31, | change "variable remory." to --variable memory.-- |
| Column 1, | Line 32, | change "of resi stance" to --of resistance-- |
| Column 16, | Line 1, | change "(FIG. 1-3)" to --(FIGS. 1-3)-- |
| Column 16, | Line 33, | change "(FIG. 1-3)" to --(FIGS. 1-3)-- |
| Column 16, | Line 40, | change "(FIG. 103)" to --(FIGS. 1-3)-- |
| Column 19, | Line 39, | change "(FIG. 1-3)" to --(FIGS. 1-3)-- |
| Column 20, | Line 12, | change "(FIG. 103)" to --(FIGS. 1-3)-- |
| Column 24, | Line 64, | change "FIG. 13," to --FIG 11G,-- |
| Column 28, | Line 52-53, | change "to FIG. 11k." to --to FIG. 11K.-- |
| Column 29, | Line 31, | change "FIGS. 12A through 12L." to --FIGS. 11A through 11L.-- |

Signed and Sealed this  
Fifth Day of January, 2021

Andrei Iancu  
*Director of the United States Patent and Trademark Office*